US006580738B2

(12) United States Patent
Fukunaga

(10) Patent No.: US 6,580,738 B2
(45) Date of Patent: Jun. 17, 2003

(54) HIGH-POWER SEMICONDUCTOR LASER DEVICE IN WHICH NEAR-EDGE PORTIONS OF ACTIVE LAYER ARE REMOVED

(75) Inventor: Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/876,128

(22) Filed: Jun. 8, 2001

(65) Prior Publication Data

US 2002/0015428 A1 Feb. 7, 2002

Related U.S. Application Data

(63) Continuation-in-part of application No. 09/731,702, filed on Dec. 8, 2000, now abandoned.

(30) Foreign Application Priority Data

Dec. 8, 1999 (JP) .......................................... 11-348527
May 28, 2001 (JP) ...................................... 2001-158404

(51) Int. Cl.[7] ................................................ H01S 5/00
(52) U.S. Cl. .......................................... 372/46; 372/75
(58) Field of Search ................................. 372/46, 75

(56) References Cited

U.S. PATENT DOCUMENTS

| 5,065,403 A | 11/1991 | Komazaki ..................... 372/46 |
| 5,345,460 A | 9/1994 | Takiguchi et al. ............ 372/43 |
| 6,233,264 B1 * | 5/2001 | Sato .............................. 372/45 |
| 2002/0051477 A1 * | 5/2002 | Fukunaga ..................... 372/46 |

FOREIGN PATENT DOCUMENTS

| JP | 01024484 | 1/1989 | ............. H01S/3/18 |

OTHER PUBLICATIONS

Highly Reliable Operation of High–Power InGaAsP/InGaP/AlGaAs 0.8μm Separate Confinement Heterostructure Lasers, Toshiaki Fukunaga, et al, J. Appl. Phys. vol. 34 (1995) pp. L1175–L1177, Part 2, No. 9B, Sep. 15, 1995.

6.1 W. continuous wave front–facet power from Al–free active–Region (λ =805 nm)diode lasers, J.K. Wade, et al, Appl. Phys. Lett.72 (1), Jan. 5 1998.

Jpn. J. Appl. Phys.; Toshiaki Fukunaga, et al.; "Highly Reliable Operation of High–Power InGaAsP/InGaP/AlGaAs 0.8 μm Separate Confinement Heterostructure Lasers"; vol. 34, Sep. 15, 1995, pp. L1175–L1177.

IEEE Journal of Quantum Electronics; Hiroki Naito, et al.; "Highly–Reliable CW Operation of 100 mW GaAlAs Buried Twin Ridge Substrate Lasers with Nonabsorbing Mirrors"; No. 6, Jun 25, 1989, pp. 1495–1499.

* cited by examiner

Primary Examiner—Paul Ip
Assistant Examiner—Dung Nguyen
(74) Attorney, Agent, or Firm—Sughrue Mion, PLLC

(57) ABSTRACT

Heating at the end face while operating in a high output is prevented and reliability improves in a semiconductor laser device. On an n-GaAs substrate, laminated are n-$Al_{z1}Ga_{1-z1}As$ lower cladding layer, an n- or i-$In_{0.49}Ga_{0.51}P$ lower optical waveguide layer, an $In_{x3}Ga_{1-x3}As_{1-y3}P_{y3}$ quantum well active layer, a p- or i-$In_{0.49}Ga_{0.51}P$ upper first optical waveguide layer, a GaAs cap layer and $SiO_2$ film. Then a width of about 20 μm of the $SiO_2$ film is removed inwardly from the cleaved surface. Using the $SiO_2$ film as a mask, the cap layer near the end face and the upper first optical waveguide layer are removed. Then the $SiO_2$ film, the quantum well active layer near the end face and the remaining cap layer are removed. A p- or i-$In_{0.49}Ga_{0.51}P$ upper second optical waveguide layer, a p-$Al_{z1}Ga_{1-z1}As$ upper cladding layer and a p-GaAs contact layer are deposited thereon.

19 Claims, 10 Drawing Sheets

A-A' CROSS SECTION

B-B' CROSS SECTION

A-A' CROSS SECTION

B-B' CROSS SECTION

A-A' CROSS SECTION

B-B' CROSS SECTION

A-A' CROSS SECTION

B-B' CROSS SECTION

A-A' CROSS SECTION

B-B' CROSS SECTION

A-A' CROSS SECTION

B-B CROSS SECTION

HIGH-POWER SEMICONDUCTOR LASER DEVICE IN WHICH NEAR-EDGE PORTIONS OF ACTIVE LAYER ARE REMOVED

This application is a continuation-in-part application of application Ser. No. 09/731,702 filed Dec. 8, 2000 now abandoned.

BACKGROUND OF THE INVENTION

1. Field of the Invention

The present invention relates to a semiconductor laser device which emits laser light having a wavelength of 0.7 to 1.2 μm.

2. Description of the Related Art

In many conventional semiconductor laser devices which emit laser light having a wavelength of 0.7 to 1.2 μm, a current confinement structure and an index-guided structure are provided in crystal layers constituting each semiconductor laser device so that each semiconductor laser device oscillates in a fundamental transverse mode.

For example, J. K. Wade et al. ("6.1 W continuous wave front-facet power from Al-free active-region (λ=805 nm) diode lasers," Applied Physics Letters, vol. 72, No. 1, 1998, pp.4–6) disclose a semiconductor laser device which emits light in the 805 nm band. The semiconductor laser device comprises an Al-free InGaAsP active layer, an InGaP optical waveguide layer, and InAlGaP cladding layers. In addition, in order to improve the characteristics in the high output power range, the semiconductor laser device includes a so-called large optical cavity (LOC) structure in which the thickness of the optical waveguide layer is increased so as to reduce the peak power density, and increase the maximum optical output power. However, when the optical power is maximized, currents generated by optical absorption in the vicinity of end faces generate heat, i.e., raise the temperature at the end faces. In addition, the raised temperature reduces the band gaps at the end faces, and therefore the optical absorption is further enhanced to damage the end face. That is, a vicious cycle is formed. This damage is the so-called catastrophic optical mirror damage (COMD). When the optical power reaches the COMD level, the optical output deteriorates with time. Further, the semiconductor laser device is likely to suddenly break down due to the COMD. Therefore, the above semiconductor laser device is not reliable when the semiconductor laser device operates with high output power.

Further, T. Fukunaga et al. ("Highly Reliable Operation of High-Power InGaAsP/InGaP/AlGaAs 0.8 μm Separate Confinement Heterostructure Lasers," Japanese Journal of Applied Physics, vol. 34 (1995) L1175–L1177) disclose a semiconductor laser device which comprises an Al-free active layer, and emits light in the 0.8 μm band. In the semiconductor laser device, an n-type AlGaAs cladding layer, an intrinsic (i-type) InGaP optical waveguide layer, an InGaAsP quantum well active layer, an i-type InGaP optical waveguide layer, a p-type AlGaAs cladding layer, and a p-type GaAs cap layer are formed on an n-type GaAs substrate. However, the maximum optical output power of the semiconductor laser device is typically 1.8 W, i.e., low.

As explained above, the conventional semiconductor laser devices which emit laser light in the 0.8 μm band are not reliable when the semiconductor laser device operates with high output power since the catastrophic optical mirror damage or the like occurs.

SUMMARY OF THE INVENTION

The object of the present invention is to provide a semiconductor laser device which emits laser light having a wavelength in the range of 0.7 to 1.2 μm, and is reliable even when the semiconductor laser device operates with high output power.

According to the present invention, there is provided a first semiconductor laser device including: a GaAs substrate of a first conductive type; a lower cladding layer of the first conductive type, formed on the GaAs substrate; a lower optical waveguide layer made of InGaP of an undoped type or the first conductive type, and formed on the lower cladding layer; an active layer made of InGaAsP or InGaAs, and formed on the lower optical waveguide layer except for near-edge areas of the lower optical waveguide layer which are adjacent to opposite end faces of the semiconductor laser device, where the opposite end faces are perpendicular to a direction of laser light which oscillates in the semiconductor laser device; a first upper optical waveguide layer made of InGaP of an undoped type or a second conductive type, and formed on the active layer; a second upper optical waveguide layer made of InGaP of an undoped type or the second conductive type, and formed over the first upper optical waveguide layer and the near-edge areas of the lower optical waveguide layer; an upper cladding layer of the second conductive type, formed on the second upper optical waveguide layer; and a contact layer of the second conductive type, formed on the upper cladding layer.

Preferably, the semiconductor laser device according to the present invention may also have one or any possible combination of the following additional features (i) to (vi).

(i) In the semiconductor laser device, a ridge structure may be formed by removing more than one portion of the upper cladding layer and the contact layer, and a bottom of the ridge structure may have a width of 1.5 μm or more.

(ii) The semiconductor laser device may further include an additional layer made of InGaAlP of the first conductive type, and formed on the second upper optical waveguide layer other than a stripe area of the second upper optical waveguide layer so as to form a stripe groove realizing a current injection window, the upper cladding layer may be formed over the additional layer so as to fill the stripe groove, and a bottom of the stripe groove may have a width of 1.5 μm or more.

(iii) The active layer may be made of $In_{x1}Ga_{1-x1}As_{1-y1}P_{y1}$ where $0 \leq x1 \leq 0.3$, $0 \leq y1 \leq 0.5$, and the product of the strain and the thickness of the active layer may be in a range of −0.15 to +0.15 nm.

The strain D of a layer formed on the GaAs substrate is defined as $D=(c-c_s)/c_s$, where $c_s$ and $c$ are the lattice constants of the GaAs substrate and the layer formed on the GaAs substrate, respectively (iv) The active layer may be a strained quantum well active layer, at least one barrier layer made of InGaP may be formed adjacent to the strained quantum well active layer, the at least one barrier layer may be oppositely strained to the strained quantum well active layer, and the sum of a first product and a second product may be in a range of −0.15 to +0.15 nm, where the first product is the product of the strain and the thickness of the active layer, and the second product is the product of the strain and the total thickness of the at least one barrier layer.

(v) Each of the lower cladding layer and the upper cladding layer may be made of $Al_{z1}Ga_{1-z1}As$, or $In_{x3}(Al_{z3}Ga_{1-z3})_{1-x3}As_{1-y3}P_{y3}$, where $0.55 \leq z1 \leq 0.8$, $x3=0.49y3\pm0.01$, $0<y3\leq1$, and $0<z3\leq1$.

(vi) Each of the lower optical waveguide layer and the first upper optical waveguide layers may be made of $In_{x2}Ga_{1-x2}P$, where $x2=0.49\pm0.01$.

According to the present invention, there is provided a second semiconductor laser device comprising: a GaAs substrate of a first conductive type; and a semiconductor layer formed on the GaAs substrate, the semiconductor layer including: a cladding layer of a first conductive type, formed on the GaAs substrate; a lower optical waveguide layer made of InGaP of the first conductive type or an undoped type, the lower optical wavelength layer being formed on the lower cladding layer; a compressive strain active layer made of InGaAsP or InGaAs, the compressive strain active layer being formed on the lower optical waveguide layer; an upper optical waveguide layer made of InGaP of a second conductive type or an undoped type, the upper optical waveguide layer being formed on the compressive strain active layer; and a cladding layer of the second conductive type.

Here, the second semiconductor laser device of the present invention is characterized in that: an InGaAsP lower barrier layer is provided between the lower optical waveguide layer and the compressive strain active layer, the InGaAsP lower barrier layer having a band gap larger than that of the compressive strain active layer; an InGaAsP upper barrier layer is provided between the compressive strain active layer and the upper optical waveguide layer, the InGaAsP lower barrier layer having a band gap larger than that of the compressive strain active layer; portions of the lower barrier layer, the compressive strain active layer and the upper barrier layer are removed, which are adjacent to two opposite end faces constituting a resonator end face among end faces obtained by cleaving the semiconductor layer; the lower and upper optical waveguide layers have band gaps larger than that of the compressive strain active layer; and the upper optical waveguide layer is buried in the removed portions of the lower barrier layer, the compressive strain active layer and the upper barrier layer.

Preferably, the semiconductor laser device according to the present invention may also have one or any possible combination of the following additional features (i) to (vii).

(i) The compressive strain active layer should be made of $In_{x3}Ga_{1-x3}As_{1-y3}P_{y3}$, where $0.49y3 < x3 \leq 0.4$ and $0 \leq y3 \leq 0.1$. Note that when $y3=0$ is satisfied, InGaAs containing no phosphorus is used.

(ii) The InGaAsP lower and upper barrier layers may have a compressive strain and a stretch strain, and the InGaAsP lower and upper barrier layers may be lattice-matched to each other. Note that an absolute value of a sum of products of strain quantities and film thickness of the InGaAsP lower and upper barrier layers shall be set to 0.3 nm or less.

(iii) A contact layer of the second conductive type should be formed in a region on the second cladding layer part, the region excluding a region corresponding to the portions where the lower barrier layer, the compressive strain active layer and the upper barrier layer are removed; and an insulating film should be formed in a region on the second cladding layer part, the region corresponding to the portions where the lower barrier layer, the compressive strain active layer and the upper barrier layer are removed.

(iv) A ridge portion may be provided, which is formed by removing both sides of a stripe-shaped portion of the cladding layer part of the second conductive type, the stripe-shaped portion extending from one resonator end face to the other resonator end face, from an upper surface of the cladding layer part of the second conductive type to a predetermined position.

(v) The cladding layer part of the second conductive type may be composed of one layer, or alternatively the cladding layer part may be composed of a plurality of layers For example, the cladding layer part of the second conductive type may comprise a first cladding layer of the second conductive type formed on the upper optical waveguide layer; a first etching stop layer made of InGaP of the second conductive type and being formed on the first cladding layer; a second etching stop layer made of GaAs having a stripe-shaped current injection opening extending from one resonator end face to the other resonator end face and being formed on the first etching stop layer; a current confinement layer made of InGaAlP of the first conductive type having a stripe-shaped current injection opening extending from one resonator end face to the other resonator end face and being formed on the second etching stop layer; a cap layer made of InGaP of the first conductive type having a stripe-shaped current injection opening extending from one resonator end face to the other resonator end face and being formed on the current confinement layer; and a second cladding layer of the second conductive type and being formed on the cap layer. Alternatively, the cladding layer part of the second conductive type may comprise an etching stop layer made of GaAs having a stripe-shaped current injection opening extending from one resonator end face to the other resonator end face and being formed on the upper optical waveguide layer; a current confinement layer of the first conductive type made of InGaAlP having a stripe-shaped current injection opening extending from one resonator end face to the other resonator end face and being formed on the etching stop layer; a cap layer of the first conductive type made of InGaP having a stripe-shaped current injection opening extending from one resonator end face to the other resonator end face and being formed on the current confinement layer; and a cladding layer of the second conductive type being formed on the cap layer.

(vi) In the second semiconductor laser device of the present invention, each of the cladding layers should be made of one of AlGaAs, InGaAlP and InGaAlAsP which are lattice-matched with the GaAs substrate.

(vii) The lower and upper barrier layers may be respectively composed of one layer of $In_{x1}Ga_{1-x1}As_{1-y1}P_{y1}$ where $0 \leq x1 \leq 0.3$ and $0 \leq y1 \leq 0.6$, or composed of two layers of $In_{x2}Ga_{1-x2}As_{1-y2}P_{y2}$ where $0 \leq x2 \leq 0.3$ and $x2=0.49y2$ and a tensile strain barrier layer made of $In_{x4}Ga_{1-x4}As_{1-y4}P_{y4}$ where $0.49y > x4 \geq 0$ and $0 < y4 \leq 0.5$, and the tensile strain barrier layer is disposed so as to be adjacent to the compressive strain active layer.

A method of manufacturing a semiconductor laser device according to the present invention in which a plurality of semiconductor layers including a compressive strain active layer are laminated on a substrate and a resonator end face is constituted by two opposite end faces, comprises the steps of: forming a cladding layer of a first conductive type on a GaAs substrate of the first conductive type; forming an InGaP lower optical waveguide layer of the first conductive type or an undoped type on the cladding layer, the lower optical waveguide layer having a band gap larger than that of the compressive strain active layer; forming an InGaAsP lower barrier layer on the lower optical waveguide layer, the lower barrier layer having a band gap larger than that of the compressive strain active layer; forming the compressive strain active layer made of one of InGaAsP and InGaAs on the lower barrier layer; forming an InGaAsP upper barrier layer on the compressive strain active layer, the upper barrier layer having a band gap larger than that of the compressive strain active layer; forming an InGaP cap layer on the upper barrier layer; forming a GaAs cap layer on the cap layer; removing a portion of the GaAs cap layer in the vicinity of an end face adjacent to the resonator end face; removing a portion of the InGaP cap layer in the vicinity of the end face using the GaAs cap layer as a mask; removing the GaAs cap layer used as the mask and simultaneously removing portions in the vicinity of the end faces of the upper barrier layer, the compressive strain active layer and the lower barrier layer using the InGaP cap layer as a mask; forming an InGaP upper optical waveguide layer of a second conductive type or an undoped type having a band gap larger than that of the compressive strain active layer on the removed portions in the vicinity of the end face and the InGaP cap layer; and forming a cladding layer of the second conductive type on the upper optical waveguide layer.

Here, the cladding layer of the second conductive type is formed by the steps of: laminating a first cladding layer of the second conductive type on the upper optical waveguide layer; laminating a first etching stop layer made of InGaP of the second conductive type on the first cladding layer; laminating a second etching stop layer made of GaAs on the first etching stop layer; laminating an InGaAlP current confinement layer of the first conductive type on the second etching stop layer; laminating an InGaP cap layer of the first conductive type on the current confinement layer; laminating a second GaAs cap layer on the InGaP cap layer; removing a portion of the second GaAs cap layer corresponding to a stripe-shaped current injection opening; removing portions of the InGaP cap layer of the first conductive type and the current confinement layer, the portions being used as the current injection opening, using the second GaAs cap layer as a mask; removing the second GaAs cap layer used as the mask and simultaneously moving a portion of the second etching stop layer, the portion being used as the current injection opening, using the InGaP cap layer of the first conductive type as a mask; and forming a second cladding layer of the second conductive type so as to cover the current injection opening.

Alternatively, the cladding layer part of the second conductive type may be formed by the steps of: laminating a GaAs etching stop layer on the upper optical waveguide layer; laminating an InGaAlP current confinement layer of the first conductive type on the second GaAs etching stop layer; laminating an InGaP cap layer of the first conductive type on the current confinement layer; laminating a second GaAs cap layer on the InGaP cap layer; removing a portion of the second GaAs cap layer corresponding to a stripe-shaped current injection opening; removing portions of the InGaP cap layer of the first conductive type and the current confinement layer, the portions being used as the current injection opening, using the second GaAs cap layer as a mask; removing the second GaAs cap layer used as the mask and simultaneously removing a portion of the GaAs etching stop layer, the portion being used as the current injection opening, using the InGaP cap layer as a mask; and forming a cladding layer of the second conductive type so as to cover the current injection opening.

The first semiconductor laser devices according to the present invention have the following advantages.

In the semiconductor laser device according to the present invention, near-edge portions of the active layer and the first upper optical waveguide layer are removed, where the near-edge portions are adjacent to opposite end faces of the semiconductor laser device, and the opposite end faces are perpendicular to the direction of laser light which oscillates in the semiconductor laser device. In addition, the second upper optical waveguide layer is formed in the near-edge spaces from which the above near-edge portions of the active layer and the first upper optical waveguide layer are removed, and the second upper optical waveguide layer has a band gap greater than that of the active layer. That is, regions which are unabsorbent of (transparent to) the laser light oscillating in the semiconductor laser device are formed in the vicinity of the opposite end faces, and thus the aforementioned current generation caused by light absorption in the vicinity of the end faces can be prevented. Accordingly, the heat generation in the vicinity of the end faces during the high output power operation can be reduced, and therefore the catastrophic optical mirror damage (COMD) can be prevented, although, as explained before, the catastrophic optical mirror damage (COMD) occurs when the light absorption is enhanced by reduction of the band gap due to the heat generation at the end faces. Consequently, the optical output power of the semiconductor laser device according to the present invention can be greatly increased without the catastrophic optical mirror damage (COMD). That is, the semiconductor laser device according to the present invention is reliable even when the semiconductor laser device operates with high output power.

Further, when regions in the vicinity of opposite end faces of a semiconductor laser device having an internal-stripe type index-guided structure and an oscillation region with a width of 1.5 μm or more, and oscillating in a fundamental transverse mode are made unabsorbent of (transparent to) laser light which oscillates in the semiconductor laser device, the semiconductor laser device is reliable even when the semiconductor laser device operates with high output power.

The second semiconductor laser device of the present invention adopts the structure (a so called window structure), in which the InGaAsP lower barrier layers having a band gap larger than that of the compressive strain active layer are provided between the lower optical waveguide layer and the compressive strain active layer as well as between the compressive strain active layer and the upper optical waveguide layer, the portions adjacent to the two opposite end faces that constitute the resonator end faces among the end faces obtained by cleaving the semiconductor layer are removed, and the upper optical waveguide layer having a band gap larger than that of the active layer is buried in the removed portions. Since a transparent region for oscillation light can be formed in the vicinity of the end face, it is possible to reduce current generated by light absorption at the end face. Thus, heat generation of the device at the end face can be decreased, and a breakdown level of the end face due to thermal runway generated in the end face can be significantly improved. Accordingly, the present invention can provide a semiconductor laser device with high reliability even when the semiconductor laser device is operated with high output power.

Furthermore, when the InGaAsP barrier layer is not provided between the InGaP optical waveguide layer and the InGaAsP compressive strain active layer, it would generally require a long time for switching gas from P to As, and substitution of P with As occurs at the interface, resulting in deterioration of the quality at the interface, that is, deterioration of the quality of the active layer. However, since the InGaAsP barrier layer is provided in the present invention, switching of gas can be performed smoothly, and the quality of the active layer can be improved. Note that if the InGaAsP barrier layer has tensile strain, there is an advantage that a temperature characteristic of the element can be improved.

The contact layer of the second conductive type is formed in a region on the cladding layer of the second conductive type, the region excluding a region corresponding to the portions where the lower barrier layer, the compressive strain active layer and the upper barrier layer are removed, and the insulating film is formed in a region on the second cladding layer, the region corresponding to the portions where the lower barrier layer, the compressive strain active layer and the upper barrier layer are removed. As a result, injection of current to the window region can be suppressed more effectively, and an increase in optical output power can be achieved.

By forming the ridge portion obtained by removing a portion of the cladding layer of the second conductive type and by constructing the current confinement structure in the cladding layer of the second conductive type as composed of a plurality of layers, the structure provided with a refractive index waveguide mechanism can be obtained. Thus, it is made possible to perform mode control of a laser beam with a high precision.

According to the method of manufacturing a semiconductor laser device of the present invention, when the plurality of semiconductor layers are laminated, and when the window structure and the current injection opening are formed, a GaAs cap layer is laminated on the InGaP cap layer serving as a re-growth surface afterwards, and a predetermined spot of a layer formed under the GaAs cap layer is removed using the GaAs cap layer as a mask. Thereafter, the GaAs cap layer is removed. By use of the above-described steps, it is made possible to prevent formation of a spontaneous oxide film over the InGaP cap layer and transmutation of the layer caused by formation of the resist layer directly thereon. Furthermore, by preventing adhesion of organic matter apt to remain on the re-growth surface, occurrence of crystal defects is controlled, and element characteristics and reliability of the device can be improved.

DESCRIPTION OF PREFERRED EMBODIMENTS

Embodiments of the present invention are explained in detail below with reference to the drawings.

Firstly, embodiments of a first semiconductor laser device according to the present invention will be described with reference to FIGS. 1 to 4.

First Embodiment

Figure 1A:
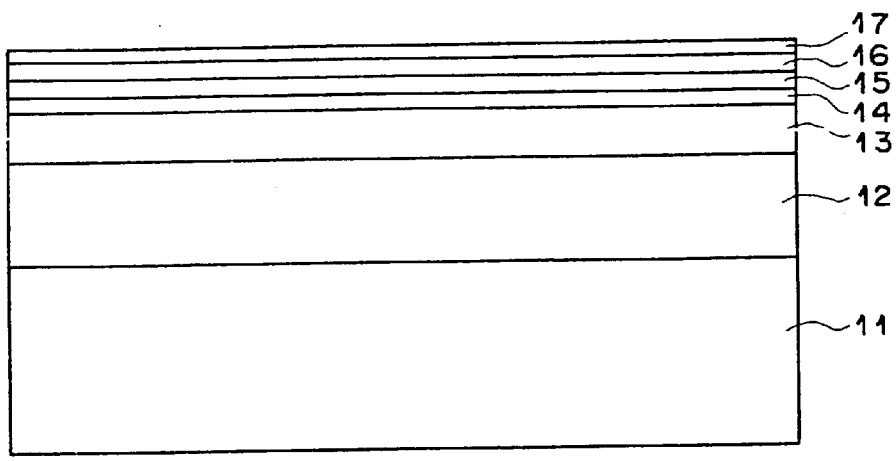
FIG. 1A is a cross-sectional view of a representative intermediate stage in a process for producing a semiconductor laser device as the first embodiment of the present invention.
Figure 1B:
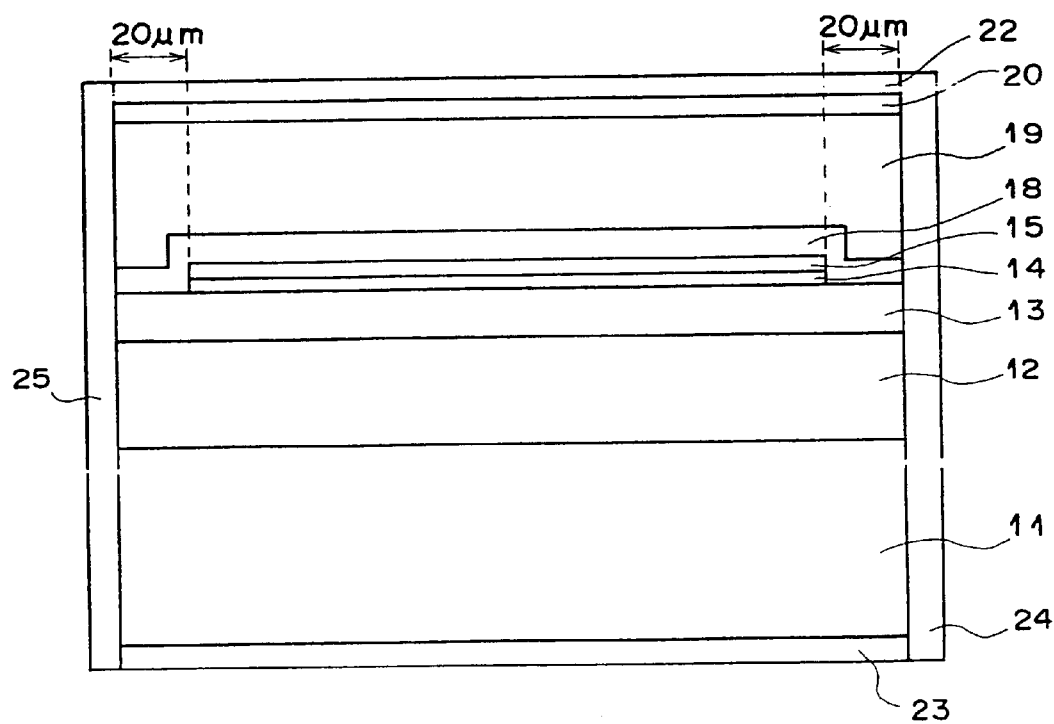
FIG. 1B is a cross-sectional view of the semiconductor laser device as the first embodiment of the present invention.

FIG. 1A is a cross-sectional view of a representative intermediate stage in a process for producing a first semiconductor laser device as the first embodiment of the present invention, and FIG. 1B is a cross-sectional view of the semiconductor laser device as the first embodiment of the present invention. The cross sections exhibited in FIGS. 1A and 1B are parallel to the direction of the laser light emitted from the semiconductor laser device.

First, as illustrated in FIG. 1A, an n-type $Al_{z1}Ga_{1-z1}As$ lower cladding layer 12 ($0.55 \leq z1 \leq 0.8$), an n-type or i-type $In_{0.49}Ga_{0.51}P$ lower optical waveguide layer 13, an $In_{x3}Ga_{1-x3}As_{1-y3}P_{y3}$ quantum well active layer 14 ($0 \leq x3 \leq 0.4$, $0 \leq y3 \leq 0.5$), a p-type or i-type $In_{0.49}Ga_{0.51}P$ first upper optical waveguide layer 15, and a GaAs cap layer 16 having a thickness of approximately 10 nm are formed on an n-type GaAs substrate 11 by organometallic vapor phase epitaxy. Then, a $SiO_2$ film 17 is formed over the n-type GaAs cap layer 16.

Thereafter, in each semiconductor laser device, near-edge portions of the $SiO_2$ film 17, which are adjacent to the end faces of the semiconductor laser device, are removed so as to expose near-edge portions of the n-type GaAs cap layer 16, where each of the near-edge portions is adjacent to an end face of the semiconductor laser device, and has a width of about 20 μm in the direction perpendicular to the end face. Since, in the actual production process, a plurality of semiconductor laser devices are formed in a wafer, stripe areas of the $SiO_2$ film 17 on the wafer, each including boundaries (corresponding to end faces) of the semiconductor laser devices in its center and having a width of about 40 μm, are removed.

Next, the near-edge portions of the n-type GaAs cap layer 16 are etched off with a sulfuric acid etchant by using the remaining areas of the $SiO_2$ film 17 as a mask so as to expose near-edge portions of the p-type or i-type $In_{0.49}Ga_{0.51}P$ first upper optical waveguide layer 15. Then, the near-edge portions of the p-type or i-type $In_{0.49}Ga_{0.51}P$ first upper optical waveguide layer 15 are etched off with a hydrochloric acid etchant until near-edge portions of the $In_{x3}Ga_{1-x3}As_{1-y3}P_{y3}$ quantum well active layer 14 are exposed. Next, the remaining areas of the $SiO_2$ film 17 are removed, and then the remaining portions of the n-type GaAs cap layer 16 and the near-edge portions of the $In_{x3}Ga_{1-x3}As_{1-y3}P_{y3}$ quantum well active layer 14 are removed by using a sulfuric acid etchant so as to expose near-edge portions of the n-type or i-type $In_{0.49}Ga_{0.51}P$ lower optical waveguide layer 13.

Finally, a p-type or i-type $In_{0.49}Ga_{0.51}P$ second upper optical waveguide layer 18, a p-type $Al_{z1}Ga_{1-z1}As$ upper cladding layer 19 ($0.55 \leq z1 \leq 0.8$), and a p-type GaAs contact layer 20 are formed over the remaining area of the p-type or i-type $In_{0.49}Ga_{0.51}P$ first upper optical waveguide layer 15 and the exposed near-edge portions of the n-type or i-type $In_{0.49}Ga_{0.51}P$ lower optical waveguide layer 13. Then, a p electrode 22 is formed on the p-type GaAs contact layer 20. In addition, the exposed surface of the substrate 11 is polished, and an n electrode 23 is formed on the polished surface of the substrate 11. Next, both end faces of the layered structure are cleaved, and a high reflectance coating 24 and a low reflectance coating 25 are provided on the respective end faces so as to form a resonator. Then, the above construction is formed into a chip.

In the semiconductor laser device as the first embodiment of the present invention, laser light oscillates between the above end faces respectively provided with the high reflectance coating 24 and the low reflectance coating 25, and exits through the end face provided with the low reflectance coating 25. Since the near-edge portions of the quantum well active layer 14 are removed, the heat generation due to the light absorption in the vicinity of the end faces can be suppressed, and therefore the catastrophic optical mirror damage (COMD) can be prevented.

The active layer may have a composition which realizes an active layer of a compressive strain type, a type which lattice-matches with the substrate, or a tensile strain type.

When the active layer is a strained quantum well type, at least one InGaP barrier layer which is oppositely strained to the active layer may be arranged adjacent to the active layer so as to compensate for the strain of the active layer. In this case, it is preferable that the sum of the product of the strain and the thickness of the active layer and the product of the strain and the total thickness of the at least one barrier layer is in the range of −0.15 to +0.15 nm.

Although the electrodes are formed on substantially the entire surface of the construction of the first embodiment, the present invention can be applied to gain-guided stripe type semiconductor laser devices in which a striped insulation layer is formed, or index-guided semiconductor laser devices which are formed by using the conventional lithography or dry etching, or semiconductor laser devices having a diffraction lattice, or integrated circuits.

The active layer may have a multiple quantum well structure made of InGaP and InGaAsP layers. In this case, it is preferable that the product sum of the tensile strains and thicknesses of the respective tensile strained layers is in the range of −0.15 to +0.15 nm. In addition, it is preferable that near-edge portions of the multiple quantum well active layer which are adjacent to the end faces are etched off by alternatively using a sulfuric acid etchant and a hydrochloric acid etchant, until the lower optical waveguide is exposed. Thereafter, the near-edge spaces from which the near-edge portions of the multiple quantum well active layer are removed are filled with the p-type or i-type $In_{0.49}Ga_{0.51}P$ second upper optical waveguide layer 18.

Second Embodiment

Figure 2A:
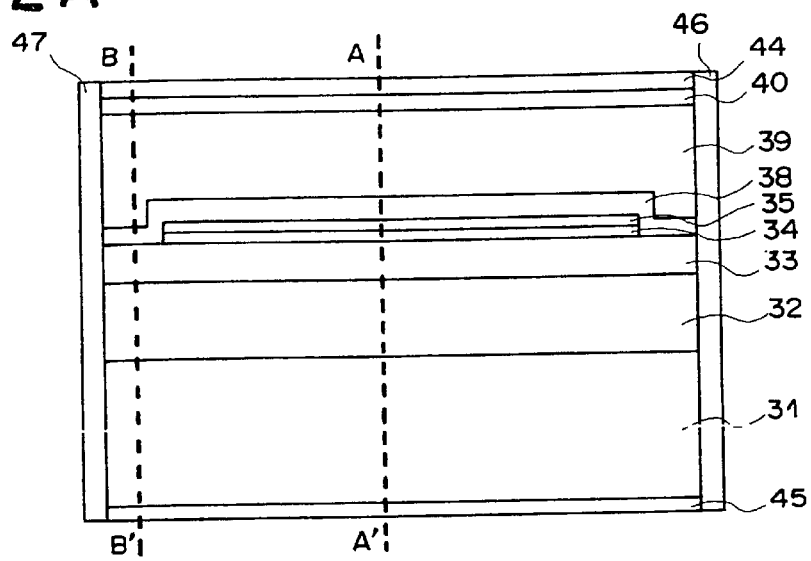
FIGS. 2A to 2C are cross-sectional views of a semiconductor laser device as the second embodiment of the present invention.
Figure 2B:
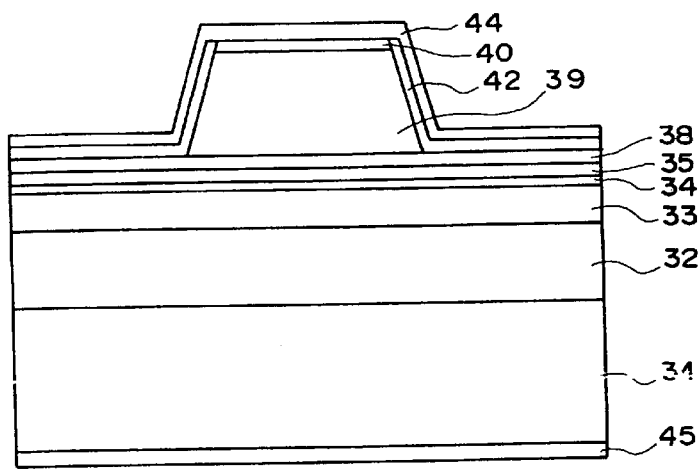
Figure 2C:
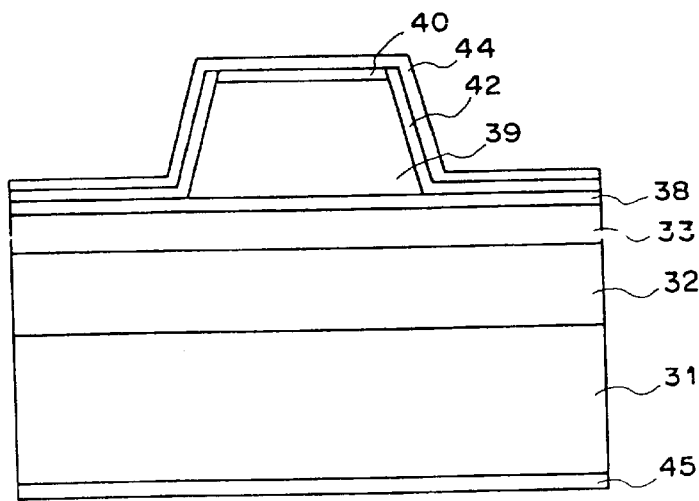

FIGS. 2A to 2C are cross-sectional views of a semiconductor laser device as the second embodiment of the present invention. The cross section shown in FIG. 2A is parallel to the direction of the laser light emitted from the semiconductor laser device. FIG. 2B shows the cross section B–B' in the vicinity of the end face, and FIG. 2C shows the cross section A–A' in the central portion of the semiconductor laser device.

First, as illustrated in FIG. 2A, an n-type $Al_{z1}Ga_{1-z1}As$ lower cladding layer 32 ($0.55 \leq z1 \leq 0.8$), an n-type or i-type $In_{0.49}Ga_{0.51}P$ lower optical waveguide layer 33, an $In_{x3}Ga_{1-x3}As_{1-y3}P_{y3}$ quantum well active layer 34 ($0 \leq x3 \leq 0.3$, $0 \leq y3 \leq 0.5$), a p-type or i-type $In_{0.49}Ga_{0.51}P$ first upper optical waveguide layer 35, and a GaAs cap layer 36 (not shown) having a thickness of approximately 10 nm are formed on an n-type GaAs substrate 31 by organometallic vapor phase epitaxy. Then, a $SiO_2$ film 37 (not shown) is formed over the n-type GaAs cap layer 36.

Thereafter, in each semiconductor laser device, near-edge portions of the $SiO_2$ film 37, which are adjacent to the end faces of the semiconductor laser device, are removed so as to expose near-edge portions of the n-type GaAs cap layer 36, where each of the near-edge portions is adjacent to an end face of the semiconductor laser device, and has a width of about 20 μm in the direction perpendicular to the end face. Since, in the actual production process, a plurality of semiconductor laser devices are formed in a wafer, stripe areas of the $SiO_2$ film 37 on the wafer, each including boundaries (corresponding to end faces) of the semiconductor laser devices in its center and having a width of about 40 μm, are removed.

Next, the near-edge portions of the n-type GaAs cap layer 36 is etched off with a sulfuric acid etchant by using the remaining areas of the $SiO_2$ film 37 as a mask so as to expose near-edge portions of the p-type or i-type $In_{0.49}Ga_{0.51}P$ first upper optical waveguide layer 35. Then, the near-edge portions of the p-type or i-type $In_{0.49}Ga_{0.51}P$ first upper optical waveguide layer 35 are etched off with a hydrochloric acid etchant until near-edge portions of the $In_{x3}Ga_{1-x3}As_{1-y3}P_{y3}$ quantum well active layer 34 are exposed. Next, the remaining areas of the $SiO_2$ film 37 are removed, and then the remaining portions of the n-type GaAs cap layer 36 and the near-edge portions of the $In_{x3}Ga_{1-x3}As_{1-y3}P_{y3}$ quantum well active layer 34 are removed by using a sulfuric acid etchant so as to expose near-edge portions of the n-type or i-type $In_{0.49}Ga_{0.51}P$ lower optical waveguide layer 33.

Thereafter, a p-type or i-type $In_{0.49}Ga_{0.51}P$ second upper optical waveguide layer 38, a p-type $Al_{z1}Ga_{1-z1}As$ upper cladding layer 39, and a p-type GaAs contact layer 40 are formed over the remaining area of the p-type or i-type $In_{0.49}Ga_{0.51}P$ first upper optical waveguide layer 35 and the exposed near-edge portions of the n-type or i-type $In_{0.49}Ga_{0.51}P$ lower optical waveguide layer 33.

Then, an insulation film 41 (not shown) is formed on the p-type GaAs contact layer 40, and parallel stripe areas of the insulation film 41, each having a width of about 6 μm, are removed by conventional lithography so as to leave a stripe area of the insulation film 41 having a width of about 3 μm. Next, the layered structure formed as above is etched to the depth of the upper surface of the p-type $In_{0.49}Ga_{0.51}P$ second upper optical waveguide layer 38 by wet etching using the remaining areas of the insulation film 41 as a mask so as to form a ridge stripe structure, as illustrated in FIG. 2B. When a solution of sulfuric acid and hydrogen peroxide is used as an etchant, the etching automatically stops at the upper boundary of the p-type $In_{0.49}Ga_{0.51}P$ second upper optical waveguide layer 38.

The total thickness of the first and second upper optical waveguide layers is such a value that a fundamental transverse mode oscillation is achieved even when the semiconductor laser device operates with high output power.

Thereafter, an insulation layer 42 is formed over the layered structure formed as above, and a stripe area of the insulation layer 42 at the top of the ridge stripe structure is removed by using conventional lithography. Then, a p electrode 44 is formed on the top of the ridge stripe structure. In addition, the exposed surface of the substrate 31 is polished, and an n electrode 45 is formed on the polished surface of the substrate 31. Next, both end faces of the layered structure are cleaved, and a high reflectance coating 46 and a low reflectance coating 47 are provided on the respective end faces so as to form a resonator. Then, the above construction is formed into a chip.

As illustrated in FIG. 2A, the $In_{x3}Ga_{1-x3}As_{1-y3}P_{y3}$ quantum well active layer 34 and the p-type or i-type $In_{0.49}Ga_{0.51}P$ first upper optical waveguide layer 35 are formed over the entire area except for near-edge areas which are adjacent to the end faces. That is, the $In_{x3}Ga_{1-x3}As_{1-y3}P_{y3}$ quantum well active layer 34 and the p-type or i-type $In_{0.49}Ga_{0.51}P$ first upper optical waveguide layer 35 are removed in the vicinity of the end faces of the semiconductor laser device. Therefore, near-edge regions of the semiconductor laser device through which laser light passes are unabsorbent of (transparent to) the laser light which oscillates in the semiconductor laser device, and heat generation in the vicinity of the end faces can be suppressed. Thus, the COMD level can be raised. That is, the semiconductor laser device as the second embodiment of the present invention is also reliable even when the semiconductor laser device operates with high output power.

The above semiconductor laser device as the second embodiment oscillates in a fundamental transverse mode. However, when the present invention is applied to a semiconductor laser device which includes an oscillation region having a width of 1.5 μm or more, the semiconductor laser device can also operate with high output power and low noise even in multiple modes.

Third Embodiment

Figure 3A:
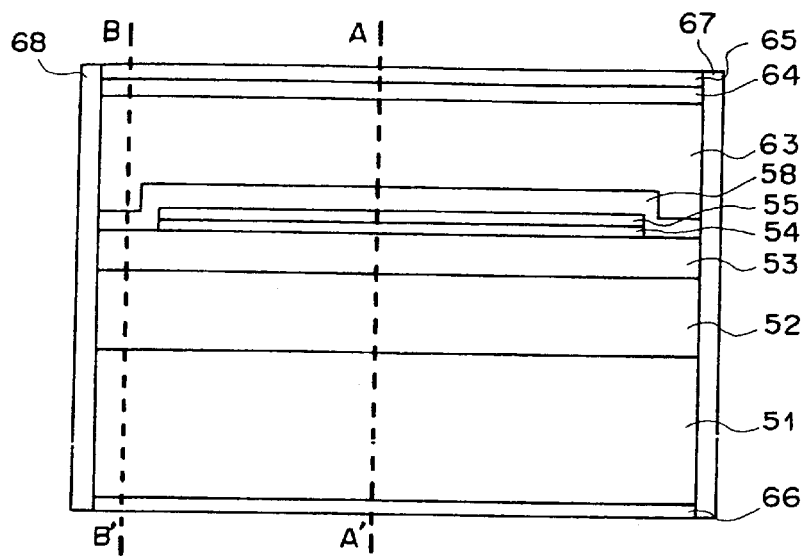
FIGS. 3A to 3C are cross-sectional views of a semiconductor laser device as the third embodiment of the present invention.
Figure 3B:
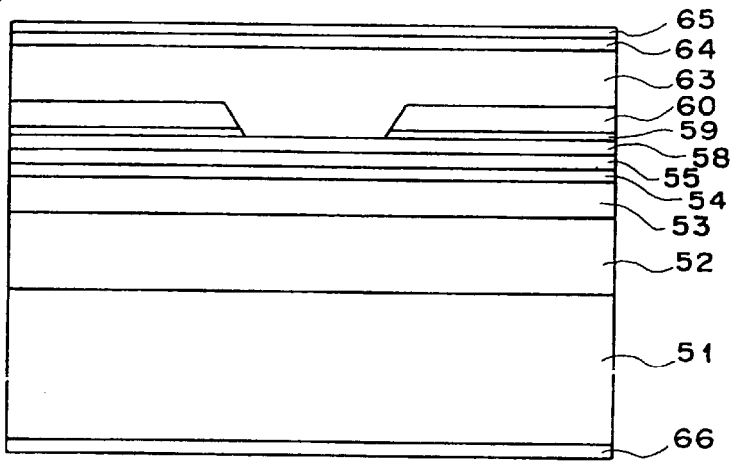
Figure 3C:
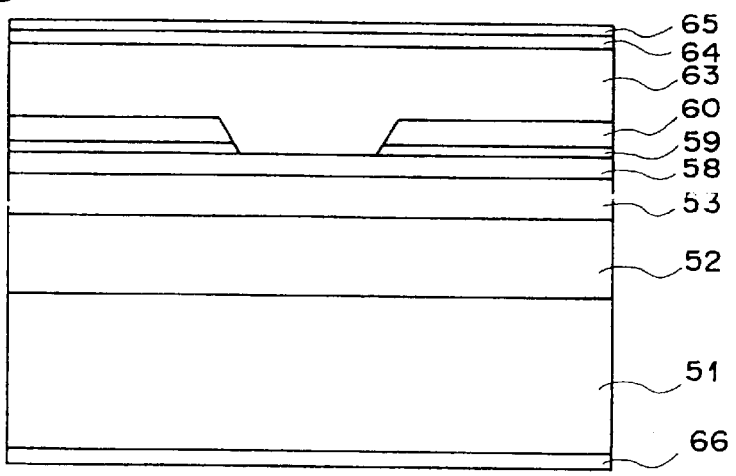

FIGS. 3A to 3C are cross-sectional views of a semiconductor laser device as the third embodiment of the present invention. The cross section shown in FIG. 3A is parallel to the direction of the laser light emitted from the semiconductor laser device. FIG. 3B shows the cross section B–B' in the vicinity of the end face, and FIG. 3C shows the cross section A–A' in the central portion of the semiconductor laser device.

First, as illustrated in FIG. 3A, an n-type $In_{0.49}(Ga_{1-z2}Al_{z2})_{0.51}P$ lower cladding layer 52 ($0.1 \leq z2 < z3$), an n-type or i-type $In_{0.49}Ga_{0.51}P$ lower optical waveguide layer 53, an $In_{x3}Ga_{1-x3}As_{1-y3}P_{y3}$ quantum well active layer 54 ($0 \leq x3 \leq 0.3$, $0 \leq y3 \leq 0.5$), a p-type or i-type $In_{0.49}Ga_{0.51}P$ first upper optical waveguide layer 55, and a GaAs cap layer 56 (not shown) having a thickness of approximately 10 nm are formed on an n-type GaAs substrate 51 by organometallic vapor phase epitaxy. Then, a $SiO_2$ film 57 (not shown) is formed over the n-type GaAs cap layer 56.

Next, in each semiconductor laser device, near-edge portions of the $SiO_2$ film 57, which are adjacent to the end faces of the semiconductor laser device, are removed so as to expose near-edge portions of the n-type GaAs cap layer 56, where each of the near-edge portions is adjacent to an end face of the semiconductor laser device, and has a width of about 20 μm in the direction perpendicular to the end face. Since, in the actual production process, a plurality of semiconductor laser devices are formed in a wafer, stripe areas of the $SiO_2$ film 57 on the wafer, each including boundaries (corresponding to end faces) of the semiconductor laser devices in its center and having a width of about 40 μm, are removed.

Thereafter, the near-edge portions of the n-type GaAs cap layer 56 are etched off with a sulfuric acid etchant by using the remaining areas of the $SiO_2$ film 57 as a mask so as to expose near-edge portions of the p-type or i-type $In_{0.49}Ga_{0.51}P$ first upper optical waveguide layer 55. Then, the near-edge portions of the p-type or i-type $In_{0.49}Ga_{0.51}P$ first upper optical waveguide layer 55 are etched off with a hydrochloric acid etchant until near-edge portions of the $In_{x3}Ga_{1-x3}As_{1-y3}P_{y3}$ quantum well active layer 54 are exposed. Next, the remaining areas of the $SiO_2$ film 57 are removed, and then the remaining portions of the n-type GaAs cap layer 56 and the near-edge portions of the $In_{x3}Ga_{1-x3}As_{1-y3}P_{y3}$ quantum well active layer 54 are removed by using a sulfuric acid etchant so as to expose near-edge portions of the n-type or i-type $In_{0.49}Ga_{0.51}P$ lower optical waveguide layer 53.

Next, a p-type $In_{0.49}Ga_{0.51}P$ second upper optical waveguide layer 58, a p-type $In_{x4}Ga_{1-x4}As_{1-y4}P_{y4}$ etching stop layer 59 ($0 \leq x4 \leq 0.3$, $0 \leq y4 \leq 0.6$), an n-type $In_{0.49}(Ga_{1-z3}Al_{z3})_{0.51}P$ current confinement layer 60 ($z2 < z3 \leq 1$), and an n-type GaAs cap layer 61 (not shown) are formed on the layered structure formed as above. Then, a resist is applied to the n-type GaAs cap layer 61, and a stripe area of the resist having a width of about 3 μm and extending in the direction perpendicular to the end faces is removed by using conventional lithography in order to form a current injection window. Next, a stripe area of the n-type GaAs cap layer 61, which is exposed by the above removal of the stripe area of the resist, is etched off with a sulfuric acid etchant by using the remaining resist as a resist mask, and then a stripe area of the n-type $In_{0.49}(Ga_{1-z3}Al_{z3})_{0.51}P$ current confinement layer 60 under the removed stripe area of the n-type GaAs cap layer 61 is etched off with a hydrochloric acid etchant by using the remaining resist as a resist mask. Next, the remaining resist is removed, and the remaining area of the n-type GaAs cap layer 61 and a stripe area of the p-type $In_{x4}Ga_{1-x4}As_{1-y4}P_{y4}$ etching stop layer 59 are etched off with a sulfuric acid etchant.

Subsequently, a p-type $In_{0.49}(Ga_{1-z1}Al_{z1})_{0.51}P$ upper cladding layer 63 and a p-type GaAs contact layer 64 are formed over the layered structure formed as above. The total thickness of the first and second upper optical waveguide layers 55 and 58 is such a value that a fundamental transverse mode oscillation is achieved even when the semiconductor laser device operates with high output power. Finally, a p electrode 65 is formed on the p-type GaAs contact layer 64. In addition, the exposed surface of the substrate 51 is polished, and an n electrode 66 is formed on the polished surface of the substrate 51. Next, both end faces of the layered structure are cleaved, and a high reflectance coating 67 and a low reflectance coating 68 are provided on the respective end faces so as to form a resonator. Then, the above construction is formed into a chip.

As illustrated in FIG. 3B, the semiconductor laser device as the third embodiment of the present invention includes an internal-stripe type index-guided structure realized by the provision of the current confinement layer, and the $In_{x3}Ga_{1-x3}As_{1-y3}P_{y3}$ quantum well active layer 54 and the p-type or i-type $In_{0.49}Ga_{0.51}P$ first upper optical waveguide layer 55 extend over the entire area except for the near-edge areas which are adjacent to the end faces of the semiconductor laser device. That is, as illustrated in FIG. 3C, the $In_{x3}Ga_{1-x3}As_{1-y3}P_{y3}$ quantum well active layer 54 and the p-type or i-type $In_{0.49}Ga_{0.51}P$ first upper optical waveguide layer 55 are removed in the vicinity of the end faces of the semiconductor laser device. Therefore, near-edge regions (i.e., regions in the vicinity of the end faces) of the semiconductor laser device are unabsorbent of (transparent to) the laser light which oscillates in the semiconductor laser device, and heat generation in the vicinity of the end faces can be suppressed. Thus, the COMD level can be raised. That is, the semiconductor laser device as the third embodiment of the present invention is also reliable even when the semiconductor laser device operates with high output power.

Due to the above construction, the above semiconductor laser device as the third embodiment oscillates in a fundamental transverse mode even when the semiconductor laser device operates with high optical output power. However, when the present invention is applied to a semiconductor laser device which includes an oscillation region having a width of 1.5 μm or more, the semiconductor laser device can also operate with high output power and low noise even in multiple modes.

Fourth Embodiment

Figure 4A:
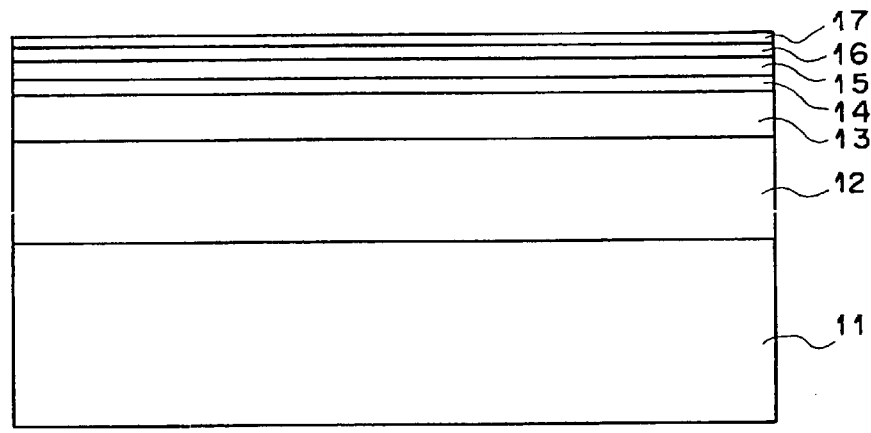
FIG. 4A is a cross-sectional view of a representative intermediate stage in a process for producing a semiconductor laser device as the fourth embodiment of the present invention.
Figure 4B:
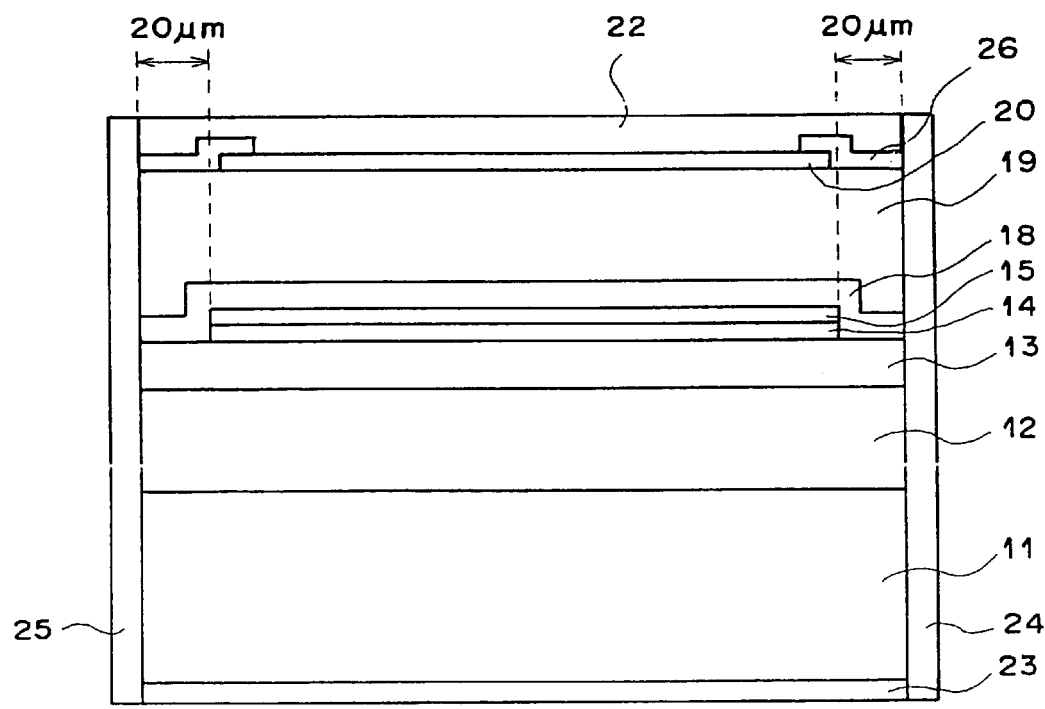
FIG. 4B is a cross-sectional view of the semiconductor laser device as the fourth embodiment of the present invention.

FIG. 4A is a cross-sectional view of a representative intermediate stage in a process for producing a semiconductor laser device as the fourth embodiment of the present invention, and FIG. 4B is a cross-sectional view of the semiconductor laser device as the fourth embodiment of the present invention. The cross sections shown in FIGS. 4A and 4B are parallel to the direction of the laser light emitted from the semiconductor laser device.

The layers from the n-type GaAs substrate 11 to the p-type $Al_{z1}Ga_{1-z1}As$ upper cladding layer 19 of the semiconductor laser device as the fourth embodiment of the present invention are identical to the corresponding layers of the construction of the first embodiment. However, in the fourth embodiment, after the p-type GaAs contact layer 20 is formed on the p-type $Al_{z1}Ga_{1-z1}As$ upper cladding layer 19, near-edge portions (i.e., portions in the vicinity of the end faces) of the p-type GaAs contact layer 20 are removed by using conventional lithography. Next, an insulation layer 26 is formed over the above layered structure, and an area of the insulation layer 26 corresponding to a current injection window is removed so as to expose the corresponding area of the p-type GaAs contact layer 20 as illustrated in FIG. 4B. Then, a p electrode 22 is formed over the p-type GaAs contact layer 20 and the remaining portions of the insulation layer 26. In addition, the exposed surface of the substrate 11 is polished, and an n electrode 23 is formed on the polished surface of the substrate 11. Finally, the above construction is formed into a chip in the same manner as the first embodiment.

Additional Matters to First to Fourth Embodiments (i) Although n-type GaAs substrates are used in the constructions of the first to fourth embodiments, instead, p-type GaAs substrates may be used. When the GaAs substrates are a p-type, the conductivity types of all of the other layers in the constructions of the first to fourth embodiments should be inverted.

(ii) When the active layers in the semiconductor laser devices as the first to fourth embodiments are $In_{x3}Ga_{1-x3}As_{1-y3}P_{y3}$ compressive strain quantum well active layers ($0<x3\leq0.4$, $0\leq y3\leq0.1$), the oscillation wavelengths of the semiconductor laser devices as the first to fourth embodiments can be controlled in the range of 700 to 1,200 nm.

(iii) Each layer in the semiconductor laser devices as the first to fourth embodiments may be formed by molecular beam epitaxy using solid or gas raw material.

(iv) In addition, all of the contents of Japanese Patent Application, No. 11(1999)-348527 are incorporated into this specification by reference.

Now, embodiments of a second semiconductor laser device according to the present invention will be described in detail with reference to FIGS. 5 to 10.

Fifth Embodiment

Figure 5A:
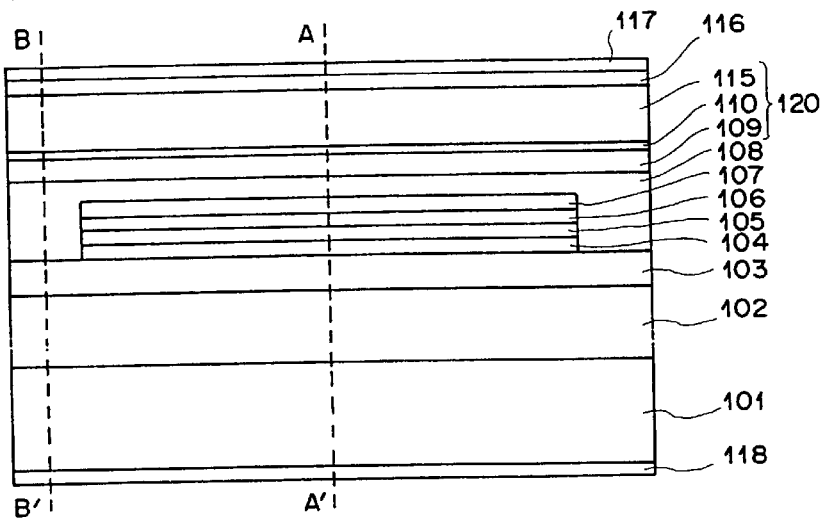
FIGS. 5A to 5C are cross-sectional views of a semiconductor laser device as the fifth embodiment of the present invention.
Figure 5B:
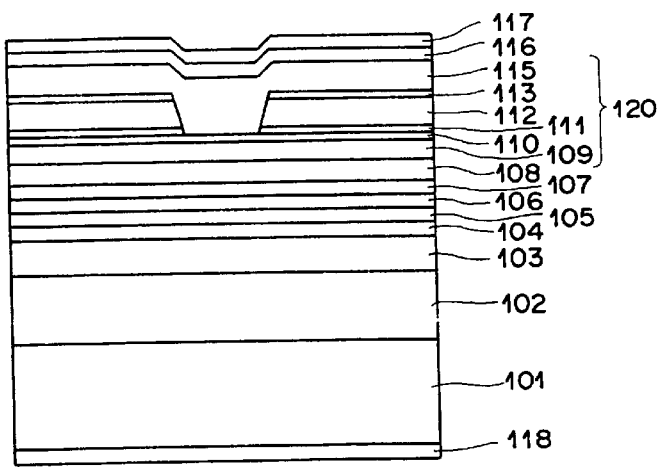
Figure 5C:
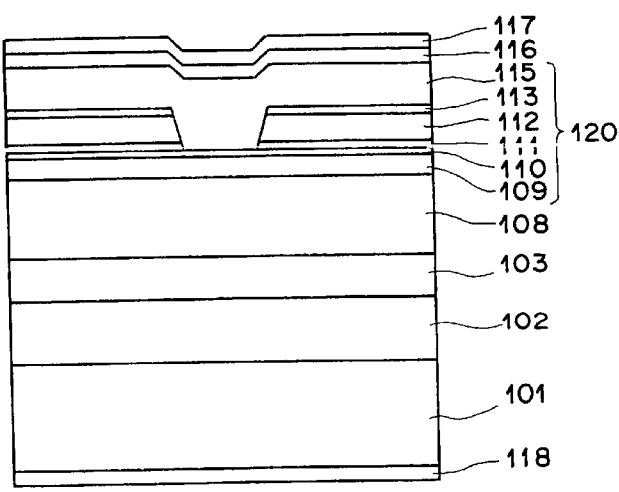

The semiconductor laser device of a fifth embodiment of the present invention will be described in detail with reference to FIGS. 5A to 5C. In the drawings, FIG. 5A is a sectional side view including an active region. FIG. 5B is a sectional view taken along the line A–A', which shows the central portion of the semiconductor laser device in the direction perpendicular to a resonance direction thereof. FIG. 5C is a sectional view taken along the line B–B', which is the sectional view in the vicinity of an end face of the semiconductor laser device in the direction perpendicular to the resonance direction thereof.

A fifth embodiment of the present invention is shown in FIGS. 5A to 5C, and the structure of the semiconductor laser device of this embodiment will be described together with manufacturing processes for manufacturing the semiconductor laser device. First, on a n-type GaAs substrate 101, laminated are an n-type $Ga_{1-z1}Al_{z1}As$ cladding layer 102 ($0.57\leq z1\leq0.8$), an n-type or i-type $In_{0.49}Ga_{0.51}P$ lower optical waveguide layer 103, an i-type $In_{x1}Ga_{1-x1}As_{1-y1}P_{y1}$ lower barrier layer 104 ($0\leq x1\leq0.3$, $0\leq y1\leq0.6$), an $In_{x3}Ga_{1-x3}As_{1-y3}P_{y3}$ compressive strain quantum well active layer 105 ($0.49y3<x3\leq0.4$, $0\leq y3\leq0.1$), an i-type $In_{x1}Ga_{1-x1}As_{1-y1}P_{y1}$ upper barrier layer 106 having a film thickness of about 5 nm, and an $In_{0.49}Ga_{0.51}P$ cap layer 107 having a film thickness of about 10 nm by an organometallic vapor phase growth method. Resist is coated on the cap layer 107. By use of an ordinary lithography technique, a removal process is performed on the resist so as to form stripe-shaped portions having a width of about 40 μm at a predetermined cycle of a resonator length, which extend in a direction expressed by the following formula.

[Formula 1] $<0\bar{1}1>$

The $In_{0.49}Ga_{0.51}P$ cap layer 107 is etched by hydrochloric acid etchant using this resist as a mask, so as to expose the $In_{x1}Ga_{1-x1}As_{1-y1}P_{y1}$ upper barrier layer 106. At this time, since the hydrochloric acid etchant is used, etching is automatically stopped immediately before the etching progresses to the upper surface of the $In_{x1}Ga_{1-x1}As_{1-y1}P_{y1}$ upper barrier layer 106. Subsequently, the resist is removed, and etching is performed by use of sulfuric acid etchant until the $In_{0.49}Ga_{0.51}P$ lower optical waveguide layer 103 is exposed. At this time, since the sulfuric acid etchant is used, the etching is automatically stopped immediately before the etching progresses to the upper surface of the $In_{0.49}Ga_{0.51}P$ lower optical waveguide layer 103. In such a manner described above, the stripe-shaped portions (the portions in the vicinity of the end face) of the active layer 105, the lower and upper barrier layers 104 and 106 and the $In_{0.49}Ga_{0.51}P$ cap layer 107, which have a width of 40 μm and include a setting position of a resonator end, are removed.

Subsequently, a p-type or i-type $In_{0.49}Ga_{0.51}P$ upper optical waveguide layer 108 is grown so as to bury the removed portions in the vicinity of the end face. Subsequently formed are a p-type $Ga_{1-z1}Al_{z1}As$ first cladding layer 109, a p-type $In_{0.49}Ga_{0.51}P$ first etching stop layer 110 having a film thickness of about 10 nm, a GaAs second etching stop layer 111 having a film thickness of about 10 nm, an n-type $In_{0.5}(Ga_{1-z2}Al_{z2})_{0.5}P$ current confinement layer 112 ($0.2\leq z2\leq1$), an n-type $In_{0.49}Ga_{0.51}P$ cap layer 113 and a GaAs layer (not shown). Thereafter, resist is coated. Then, stripe-shaped regions of the resist are removed in a <011> direction perpendicular to the stripe-shaped portions already removed. The stripe-shaped regions of this resist correspond to a current injection opening having a width of about 1 μm to 3 μm. Stripe-shaped portions of the GaAs cap layer exposed from the resist, which correspond to the current injection opening, are removed by sulfuric acid etchant using the resist as a mask. At this time, the etching is automatically stopped immediately before the etching progresses to the upper surface of the $In_{0.49}Ga_{0.51}P$ cap layer 113. Thereafter, the resist is removed, stripe-shaped portions of the $In_{0.49}Ga_{0.51}P$ cap layer 113 exposed on the stripe-shaped portions of the GaAs cap layer are removed by hydrochloric acid etchant using the GaAs cap layer as a mask, and hence the current injection opening is formed. Subsequently, stripe-shaped portions of the n-type $In_{0.5}(Ga_{1-}$ $_{z2}Al_{z2})_{0.5}P$ current confinement layer 112 are removed, thus forming the current injection opening. Thereafter, the GaAs cap layer used as the mask is removed by sulfuric acid etchant and simultaneously stripe-shaped portions of the GaAs second etching stop layer are removed, thus forming the current injection opening.

Subsequently, a p-type $Ga_{1-z1}Al_{z1}As$ second cladding layer 115 and a p-type GaAs contact layer 116 are grown, and a p electrode 117 is formed on the contact layer 116. Thereafter, the substrate 101 is polished and an n electrode is formed on the polished surface. From the p-type first cladding layer 109 to the p-type second cladding layer 115 collectively constitute a p-type cladding layer (a cladding layer of the second conductive type) 120.

Thereafter, a high reflectance coating is provided on one of resonator surfaces formed by cleaving a sample at a position where the resonator end face is set, and a low reflectance coating is provided on the other resonator surface thereof. Then, the above construction is formed into a chip, thus completing the semiconductor laser device.

The p-type cladding layer 109 shall have a film thickness with which the semiconductor laser device can realize a high output power in a fundamental transverse mode oscillation, and the p-type first and second cladding layers 109 and 115 shall have compositions with which the semiconductor laser device can realize a high output power in the fundamental transverse mode. Specifically, the film thickness and the composition are set so that an equivalent refractive index step difference is in a range from $1.5 \times 10^{-3}$ to $7 \times 10^{-3}$. The composition of each cladding layer may satisfactorily be one having a band gap larger than that of the optical waveguide layer. As a material of each cladding layer, InGaAlP series material or InGaAlAsP series material which are lattice-matched with the GaAs substrate 101 can be employed in addition to the foregoing GaAlAs. Furthermore, the active layer may be a multiple quantum well.

Moreover, in the manufacturing step for removing the portion in the vicinity of the end face the following steps can be also used. First, a GaAs cap layer having a film thickness of about 10 nm is formed on the $In_{0.49}Ga_{0.51}P$ cap layer 107, and resist is coated on the GaAs cap layer. By use of an ordinary lithography technique, a removal process is performed on the resist so as to form stripe-shaped portions having a width of about 40 μm at a predetermined cycle of a resonator length, which extend in a direction expressed by the following formula.

[Formula 2] $<0\bar{1}1>$

The GaAs cap layer is removed to be stripe-shaped by sulfuric acid etchant using this resist as a mask. After the resist is removed, the $In_{0.49}Ga_{0.51}P$ cap layer 107 is removed by hydrochloric acid etchant using the GaAs cap layer as a mask. Subsequently, an etching step is performed with sulfuric acid etchant until the entire GaAs cap layer is removed and simultaneously the $In_{0.49}Ga_{0.51}P$ lower optical waveguide layer 103 are exposed. By using the steps in which the GaAs cap layer is provided on the $In_{0.49}Ga_{0.51}P$ cap layer 107 in the above described manner, and then this GaAs cap layer is removed, it is possible to prevent adhesion of organic substances remaining on a re-growth surface.

Sixth Embodiment

Figure 6A:
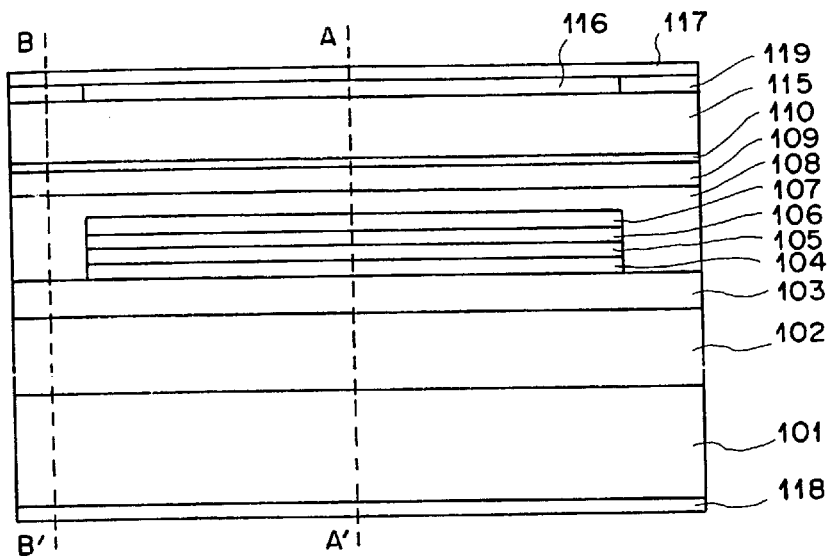
FIGS. 6A to 6C are cross-sectional views of a semiconductor laser device as the sixth embodiment of the present invention.
Figure 6B:
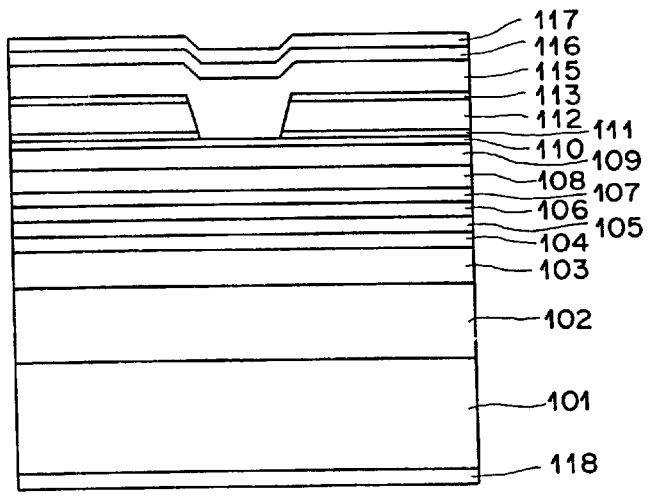
Figure 6C:
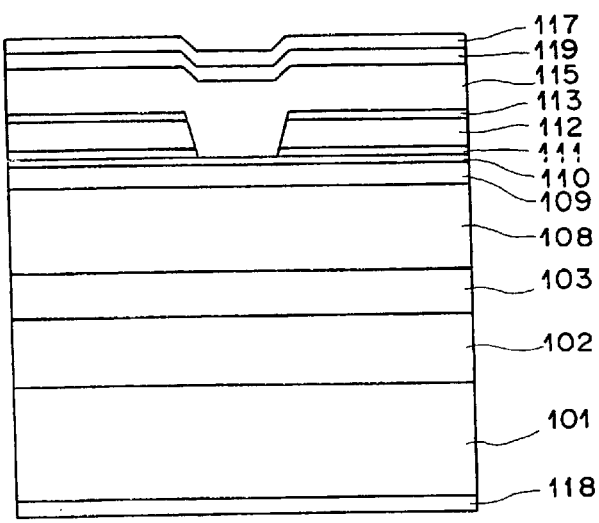

A sixth embodiment of the present invention is shown in FIGS. 6A to 6C. In the drawings, FIG. 6A is a sectional side view including an active region. FIG. 6B is a sectional view taken along the line A–A', which shows the central portion of the semiconductor laser device in the direction perpendicular to a resonance direction thereof. FIG. 6C is a sectional view taken along the line B–B', which is the sectional view in the vicinity of an end face of the semiconductor laser device in the direction perpendicular to the resonance direction thereof. Only differences of a semiconductor laser device from that of the fifth embodiment will be described. The same layers as in the fifth embodiment are denoted by the same reference numerals, and detailed descriptions for them are omitted.

Steps performed until the p-type GaAs contact layer 116 is formed are identical to the manufacturing steps of the fifth embodiment. After the p-type GaAs contact layer 116 is formed, the p-type GaAs contact layer 116 is removed in the stripe-shaped region corresponding to a region (the portion in the vicinity of the end face) where the active layer 105 is removed. The portions where the p-type GaAs contact layer 116 is removed are covered with the insulating film 119. Specifically, the insulating film 119 is formed in the portion in the vicinity of the end face instead of the contact layer 116. Thus, injection of a current to the window region (the portion in the vicinity of the end face) can be significantly suppressed, and an increase in an optical output power can be achieved.

Seventh Embodiment

Figure 7A:
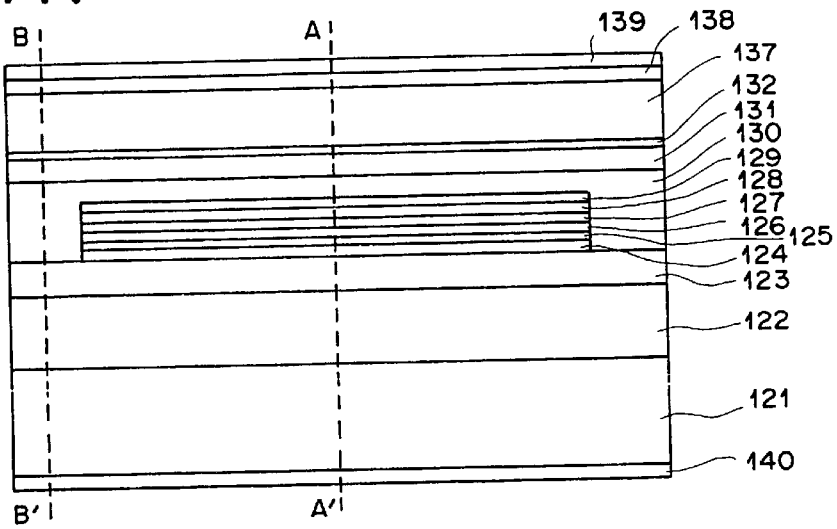
FIGS. 7A to 7C are cross-sectional views of a semiconductor laser device as the seventh embodiment of the present invention.
Figure 7B:
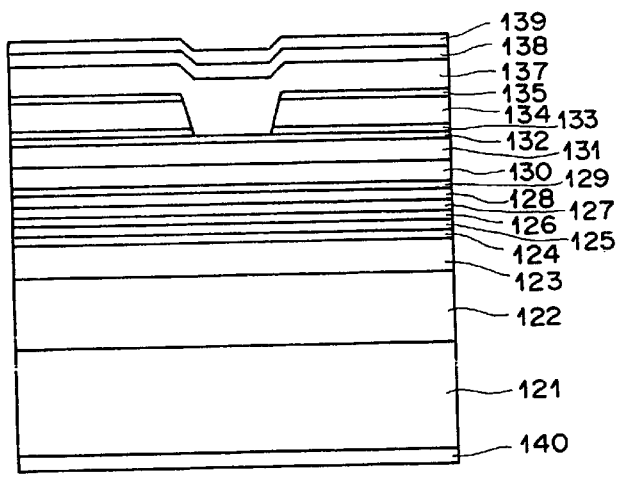
Figure 7C:
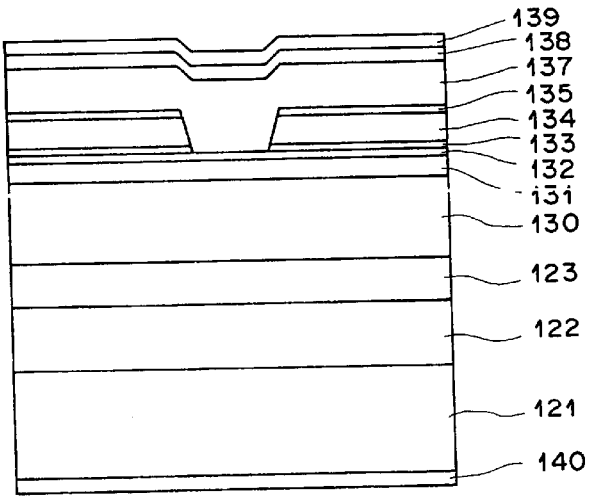

A seventh embodiment of the present invention is shown in FIGS. 7A to 7C. In the drawings, FIG. 7A is a sectional side view including an active region. FIG. 7B is a sectional view taken along the line A–A', which shows the central portion of the semiconductor laser device in the direction perpendicular to a resonance direction thereof. FIG. 7C is a sectional view taken along the line B–B', which is the sectional view in the vicinity of an end face of the semiconductor laser device in the direction perpendicular to the resonance direction thereof. Descriptions of a structure of a semiconductor laser device of the seventh embodiment will be made together with manufacturing steps thereof. First, on a n-type GaAs substrate 121, there are laminated an n-type $Ga_{1-z1}Al_{z1}As$ cladding layer 122 ($0.57 \leq z1 \leq 0.8$), an n-type or i-type $In_{0.49}Ga_{0.51}P$ lower optical waveguide layer 123, an i-type $In_{x2}Ga_{1-x2}As_{1-y2}P_{y2}$ lower barrier layer 124 ($0 \leq 2 \leq 0.3$, $x2=0.49y2$) having a film thickness of about 10 nm, an i-type $In_{x4}Ga_{1-x4}As_{1-y4}P_{y4}$ lower tensile strain barrier layer 125 ($0.49y4 > x4 \geq 0$, $0 < y4 \leq 0.5$), an $In_{x3}Ga_{1-x3}As_{1-y3}P_{y3}$ compressive strain quantum well active layer 126 ($0.49y3 < x3 < 0.4$, $0 \leq y3 \leq 0.1$), an i-type $In_{x4}Ga_{1-x4}As_{1-y4}P_{y4}$ upper tensile strain barrier layer 127, an i-type $In_{x2}Ga_{1-x2}As_{1-y2}P_{y2}$ upper barrier layer 128 having a film thickness of about 10 nm, and an $In_{0.49}Ga_{0.51}P$ cap layer 129 having a film thickness of about 5 nm by an organometallic vapor phase growth method. Resist is coated on the $In_{0.49}Ga_{0.51}P$ cap layer 129. By use of an ordinary lithography technique, a removal process is performed on the resist so as to form stripe-shaped portions having a width of about 40 μm at a predetermined cycle of a resonator length, which extend in a direction expressed by the following formula.

[Formula 3] $<0\bar{1}1>$

The $In_{0.49}Ga_{0.51}P$ cap layer 129 is etched by hydrochloric acid etchant using this resist as a mask. Thus, the $In_{x2}Ga_{1-x2}As_{1-y2}P_{y2}$ upper barrier layer 128 is exposed. At this time, since the hydrochloric acid etchant is used, etching is automatically stopped immediately before the etching progresses to the upper surface of the $In_{x2}Ga_{1-x2}As_{1-y2}P_{y2}$ upper barrier layer 128. Subsequently, the resist is removed, and etching is performed by use of sulfuric acid etchant until the $In_{0.49}Ga_{0.51}P$ lower optical waveguide layer 123 is exposed. At this time, since the sulfuric acid etchant is used, the etching is automatically stopped immediately before the etching progresses to the upper surface of the $In_{0.49}Ga_{0.51}P$ lower optical waveguide layer 123. In such a manner described above, the stripe-shaped portions (the portions in the vicinity of the end face) of the active layer 126, the lower and upper stretch barrier layers 125 and 127, the lower and upper barrier layers 124 and 128, and the $In_{0.49}Ga_{0.51}P$ cap layer 109, which have a width of 40 μm and include a setting position of a resonator end, are removed.

Subsequently, a p-type or i-type $In_{0.49}Ga_{0.51}P$ upper optical waveguide layer 130 is grown so as to bury the removed portions in the vicinity of the end face. In addition, formed are a p-type $Ga_{1-z1}Al_{z1}As$ first cladding layer 131, a p-type $In_{0.49}Ga_{0.51}P$ first etching stop layer 132 having a film thickness of about 10 nm, a GaAs second etching stop layer 133 having a film thickness of about 10 nm, an n-type $In_{0.5}(Ga_{1-z2}Al_{z2})_{0.5}P$ current confinement layer 134 ($0.2 \leq z2 \leq 1$) and an n-type $In_{0.49}Ga_{0.51}P$ cap layer 135. Thereafter, the resist is coated. Then, stripe-shaped regions of the resist are removed in a <011> direction perpendicular to the stripe-shaped portions already removed. The stripe-shaped regions of this resist correspond to a current injection opening having a width of about 1 μm to 3 μm. The stripe-shaped portions of the n-type $In_{0.49}Ga_{0.51}P$ cap layer 135 and the n-type $In_{0.5}(Ga_{1-z2}Al_{z2})_{0.5}P$ current confinement layer 134 are removed using this resist as a mask. At this time, the etching is automatically stopped immediately before the etching progresses to the upper surface of the GaAs second etching stop layer 133. Thereafter, the resist is removed, and stripe-shaped portions of the GaAs second etching stop layer 133 are removed by sulfuric acid etchant. Thus, a current injection opening is formed. Subsequently, a p-type $Ga_{1-z1}Al_{z1}As$ second cladding layer 137 and a p-type GaAs contact layer 138 are grown. The p electrode 139 is formed on the contact layer 138. Thereafter, the substrate 121 is polished, and an n electrode 140 is formed on the polished surface.

Thereafter, a high reflectance coating is provided on one of resonator surfaces formed by cleaving a sample at a position where the resonator end face is set, and a low reflectance coating is provided on the other resonator surface thereof. Then, the above construction is formed into a chip, thus completing the semiconductor laser device.

The p-type first cladding layer 131 shall have a film thickness and the p-type second cladding layer 137 shall have a composition, whereby the semiconductor laser device can realize a high output power in a fundamental transverse mode oscillation Specifically, the film thickness and the composition are set so that an equivalent refractive index step difference is in a range from $1.5 \times 10^{-3}$ to $7 \times 10^{-3}$. The composition of each cladding layer may satisfactorily be one having a band gap larger than that of the optical waveguide layer. As a material of each cladding layer, InGaAlP series material or InGaAlAsP series material which are lattice-matched with the GaAs substrate 101 can be employed in addition to the foregoing GaAlAs. Furthermore, though the active layer may be a multiple quantum well, an absolute value of a sum of products of a strain quantity and a film thickness of the tensile strain barrier layer and the compressive strain active layer should be set to 0.3 nm or less.

Eighth Embodiment

Figure 8A:
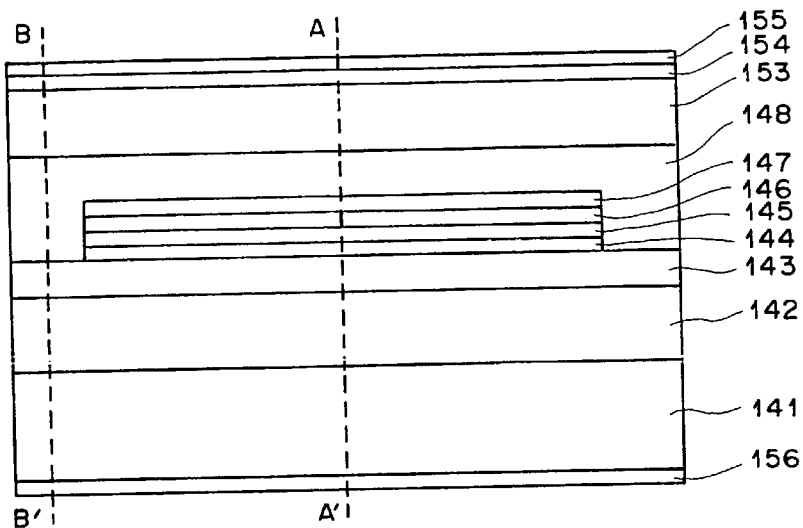
FIGS. 8A to 8C are cross-sectional views of a semiconductor laser device as the eighth embodiment of the present invention.
Figure 8B:
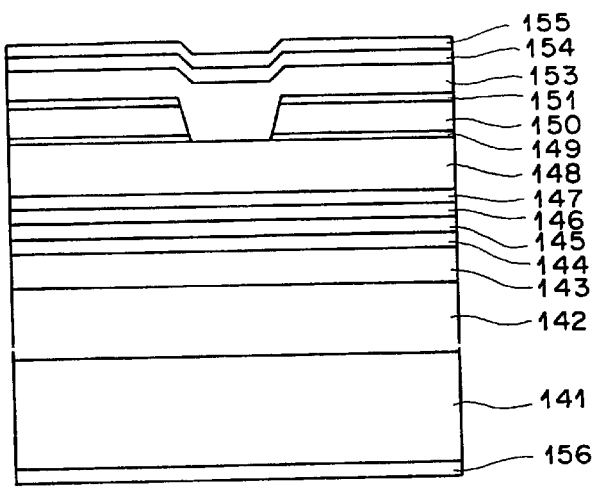
Figure 8C:
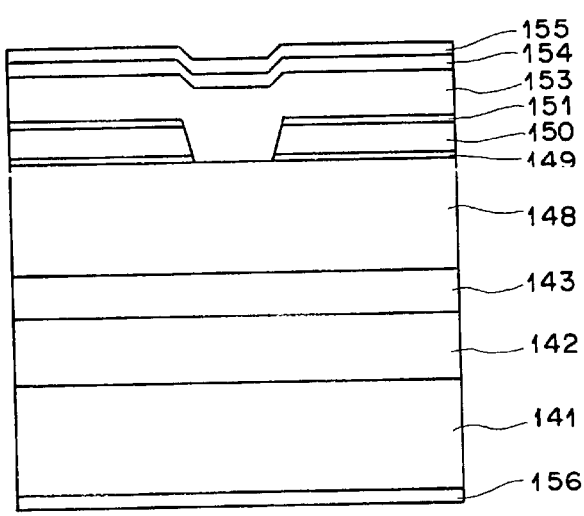

An eighth embodiment of the present invention is shown in FIGS. 8A to 8C, and a structure of a semiconductor laser device of this embodiment will be described together with manufacturing steps thereof. In the drawings, FIG. 8A is a sectional side view including an active region. FIG. 8B is a sectional view taken along the line A–A', which shows the central portion of the semiconductor laser device in the direction perpendicular to a resonance direction thereof. FIG. 8C is a sectional view taken along the line B–B', which is the sectional view in the vicinity of an end face of the semiconductor laser device in the direction perpendicular to the resonance direction thereof. First, on an n-type GaAs substrate 141, laminated are an n-type $Ga_{1-z1}Al_{z1}As$ cladding layer 142 ($0.57 \leq z1 \leq 0.8$), an n-type or i-type $In_{0.49}Ga_{0.51}P$ lower optical waveguide layer 143, an i-type $In_{x1}Ga_{1-x1}As_{1-y1}P_{y1}$ lower barrier layer 144 ($0 \leq x1 \leq 0.3$, $0.1 \leq y1 \leq 0.6$), an $In_{x3}Ga_{1-x3}As_{1-y3}P_{y3}$ compressive strain quantum well active layer 145 ($0.49y3 \leq x3 \leq 0.4$, $0 \leq y3 \leq 0.1$), an i-type $In_{x1}Ga_{1-x1}As_{1-y1}P_{y1}$ upper barrier layer 146 having a film thickness of about 5 nm, and an $In_{0.49}Ga_{0.51}P$ cap layer 147 having a film thickness of about 10 nm by an organometallic vapor phase growth method. Resist is coated on the cap layer 147. By use of an ordinary lithography technique, a removal process is performed on the resist so as to form stripe-shaped portions having a width of about 40 μm at a predetermined cycle of a resonator length, which extend in a direction expressed by the following formula.

[Formula 4] <01̄1>

The $In_{0.49}Ga_{0.51}P$ cap layer 147 is etched by hydrochloric acid etchant using this resist as a mask, so as to expose the $In_{x1}Ga_{1-x1}As_{1-y1}P_{y1}$ upper barrier layer 146. At this time, since the hydrochloric acid etchant is used, the etching is automatically stopped immediately before the etching progresses to the upper surface of the $In_{x1}Ga_{1-x1}As_{1-y1}P_{y1}$ upper barrier layer 146. Subsequently, the resist is removed, and etching is performed by use of sulfuric acid etchant until the $In_{0.49}Ga_{0.51}P$ lower optical waveguide layer 143 is exposed. At this time, since the sulfuric acid etchant is used, the etching is automatically stopped immediately before the etching progresses to the upper surface of the $In_{0.49}Ga_{0.51}P$ lower optical waveguide layer 143. In such a manner described above, the stripe-shaped portions (the portions in the vicinity of the end face) of the active layer 145, the lower and upper barrier layers 144 and 146 and the $In_{0.49}Ga_{0.51}P$ cap layer 147, which have a width of 40 μm and include a setting position of a resonator end, are removed.

Subsequently, a p-type or i-type $In_{0.49}Ga_{0.51}P$ upper optical waveguide layer 148, a GaAs etching stop layer 149 having a film thickness of about 10 nm, an n-type $In_{0.5}(Ga_{1-z2}Al_{z2})_{0.5}P$ current confinement layer 150 ($0.2 \leq z2 \leq 1$), an n-type $In_{0.49}Ga_{0.51}P$ cap layer 151 and a GaAs cap layer are formed so as to bury the removed portions in the vicinity of the end face. Thereafter, the resist is coated, and the regions of the resist having a width of 1 μm to 3 μm in a <011> direction perpendicular to the already removed stripe-shapes portions are removed, and stripe-shaped portions of the GaAs cap layer 152 are removed by sulfuric acid etchant using this resist as a mask, thus forming a current injection opening. At this time, the etching is automatically stopped immediately before the etching progresses to the upper surface of the $In_{0.49}Ga_{0.51}P$ cap layer 151. Thereafter, the resist is removed, and the stripe-shaped portions of the $In_{0.49}Ga_{0.51}P$ cap layer 151 and the n-type $In_{0.5}(Ga_{1-z2}Al_{z2})_{0.5}P$ current confinement layer 150 are removed by hydrochloric acid etchant. Thus, a current injection opening is formed. The GaAs cap layer used as the mask is removed, and the stripe-shaped portions of the GaAs etching stop layer 149 are removed, thus forming a current injection opening.

Subsequently, a p-type $Ga_{1-z1}Al_{z1}As$ second cladding layer 153 and a p-type GaAs contact layer 154 are grown. A p electrode 155 is formed on the contact layer 154. Thereafter, the substrate 141 is polished, and an n electrode 156 is formed on the polished surface.

Thereafter, a high reflectance coating is provided on one of resonator surfaces formed by cleaving a sample at a position where the resonator end face is set, and a low reflectance coating is provided on the other resonator surface thereof. Then, the above construction is formed into a chip, thus completing the semiconductor laser device.

Note that the upper optical waveguide layer 148 shall have a thickness and the p-type second cladding layer 153 shall have a composition, whereby the semiconductor laser device can realize a high output power in a fundamental transverse mode oscillation. Specifically, the film thickness and the composition are set so that an equivalent refractive index step difference is in a range from $1.5 \times 10^{-3}$ to $7 \times 10^3$.

Ninth Embodiment

Figure 9A:
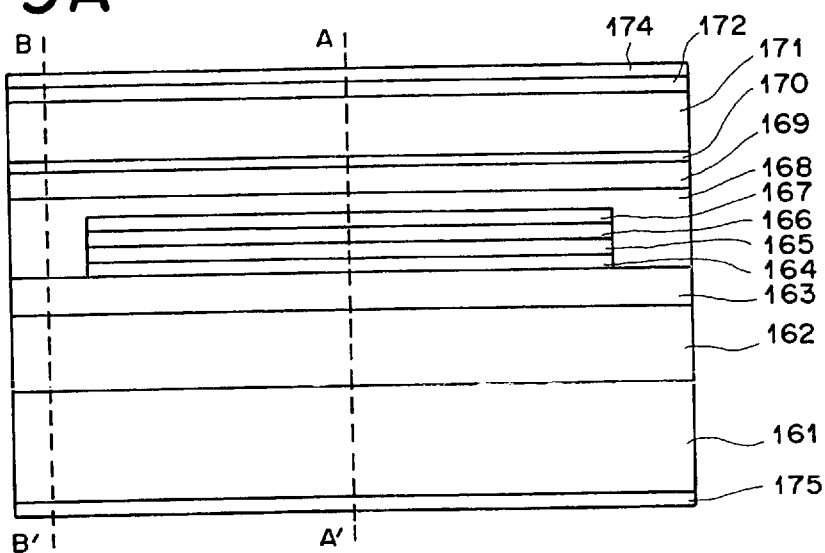
FIGS. 9A to 9C are cross-sectional views of a semiconductor laser device as the ninth embodiment of the present invention.
Figure 9B:
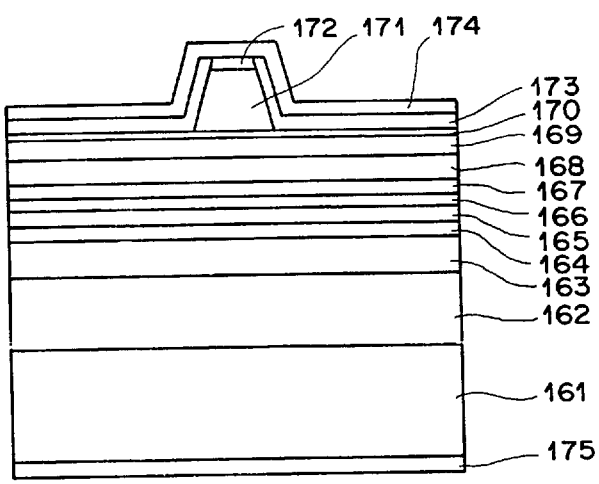
Figure 9C:
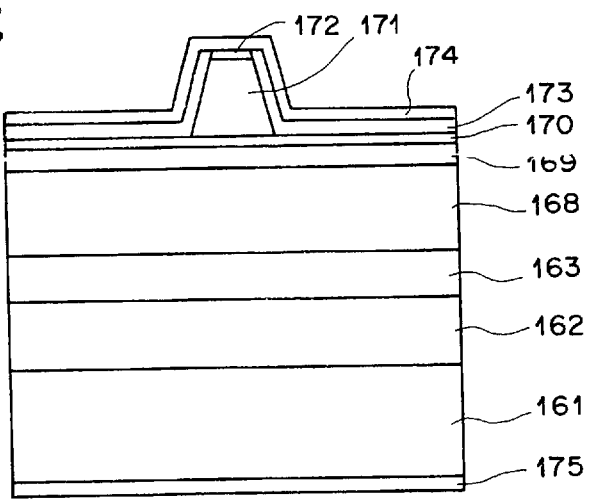

A ninth embodiment of the present invention is shown in FIGS. 9A to 9C, and a structure of a semiconductor laser device of this embodiment will be described together with manufacturing steps thereof. In the drawings, FIG. 9A is a sectional side view including an active region. FIG. 9B is a sectional view taken along the line A–A', which shows the central portion of the semiconductor laser device in the direction perpendicular to a resonance direction thereof. FIG. 9C is a sectional view taken along the line B–B', which is the sectional view in the vicinity of an end face of the semiconductor laser device in the direction perpendicular to the resonance direction thereof. First, on an n-type GaAs substrate 161, laminated are an n-type $Ga_{1-z1}Al_{z1}As$ cladding layer 162 ($0.57 \leq z1 \leq 0.8$), an n-type or i-type $In_{0.49}Ga_{0.51}P$ lower optical waveguide layer 163 having a film thickness of about 5 nm, an i-type $In_{x1}Ga_{1-x1}As_{1-y1}P_{y1}$ lower barrier layer 164 ($0 \leq x1 \leq 0.3$, $0 \leq y1 \leq 0.6$) having a film thickness of about 10 nm, an $In_{x3}Ga_{1-x3}As_{1-y3}P_{y3}$ compressive strain quantum well active layer 165 ($0.49y3 < x3 \leq 0.4$, $0 \leq y3 \leq 0.1$), an i-type $In_{x1}Ga_{1-x1}As_{1-y1}P_{y1}$ upper barrier layer 166 having a film thickness of about 10 nm and an $In_{0.49}Ga_{0.51}AsP$ cap layer 167 having a film thickness of about 5 nm by an organometallic vapor phase growth method. Resist is coated on the cap layer 167. By use of an ordinary lithography technique, a removal process is performed on the resist so as to form stripe-shaped portions having a width of about 40 μm at a predetermined cycle of a resonator length, which extend in a direction expressed by the following formula.

[Formula 5] $<0\bar{1}1>$

The $In_{0.49}Ga_{0.51}P$ cap layer 167 is etched by hydrochloric acid etchant using this resist as a mask, so as to expose the $In_{x1}Ga_{1-x1}As_{1-y1}P_{y1}$ upper barrier layer 166. At this time, since the hydrochloric acid etchant is used, the etching is automatically stopped immediately before the etching progresses to the upper surface of the $In_{x1}Ga_{1-x1}As_{1-y1}P_{y1}$ upper barrier layer 166. Subsequently, the resist is removed, and etching is performed by use of sulfuric acid etchant until the $In_{0.49}Ga_{0.51}P$ lower optical waveguide layer 163 is exposed. At this time, since the sulfuric acid etchant is used, the etching is automatically stopped immediately before the etching progresses to the upper surface of the $In_{0.49}Ga_{0.51}P$ lower optical waveguide layer 163. In such a manner described above, the stripe-shaped portions (the portions in the vicinity of the end face) of the active layer 165, the lower and upper barrier layers 164 and 166 and the $In_{0.49}Ga_{0.51}P$ cap layer 167, which have a width of 40 μm and include a setting position of a resonator end, are removed.

Subsequently, a p-type or i-type $In_{0.49}Ga_{0.51}P$ upper optical waveguide layer 168, a p-type $Ga_{1-z1}Al_{z1}As$ first cladding layer 169, a p-type $In_{0.49}Ga_{0.51}P$ etching stop layer 170 having a film thickness of about 10 nm, a p-type $Ga_{1-z1}Al_{z1}As$ second cladding layer 171 and a p-type GaAs contact layer 172 are grown so as to bury the removed portions in the vicinity of the end face. Furthermore, an insulating film (not shown) is formed, and the insulating film is removed so that stripe-shaped portions having a width of about 1 μm to 3 μm are left in a <011> direction. Both sides of the stripe-shaped portions of the p-type GaAs contact layer 172 and the p-type $Ga_{1-z1}Al_{z1}As$ second cladding layer 171 are removed by sulfuric acid etchant using this insulating film as a mask, thus forming a ridge. Subsequently, an insulating film 173 is formed, and a current injection opening is formed only in an upper portion of the ridge by an ordinary lithography technique. A p electrode 174 is formed so as to cover the current injection opening. Thereafter, the substrate 161 is polished, and an n electrode 175 is formed on the polished surface.

Thereafter, a high reflectance coating is provided on one of resonator surfaces formed by cleaving a sample at a position where the resonator end face is set, and a low reflectance coating is provided on the other resonator surface thereof. Then, the above construction is formed into a chip, thus completing the semiconductor laser device.

Note that the p-type second cladding layer shall have a film thickness with which the semiconductor laser device can realize a high output power in a fundamental transverse mode oscillation. Specifically, the film thickness is set so that an equivalent refractive index step difference is in a range from $1.5 \times 10^{-3}$ to $7 \times 10^{-3}$.

Tenth Embodiment

Figure 10A:
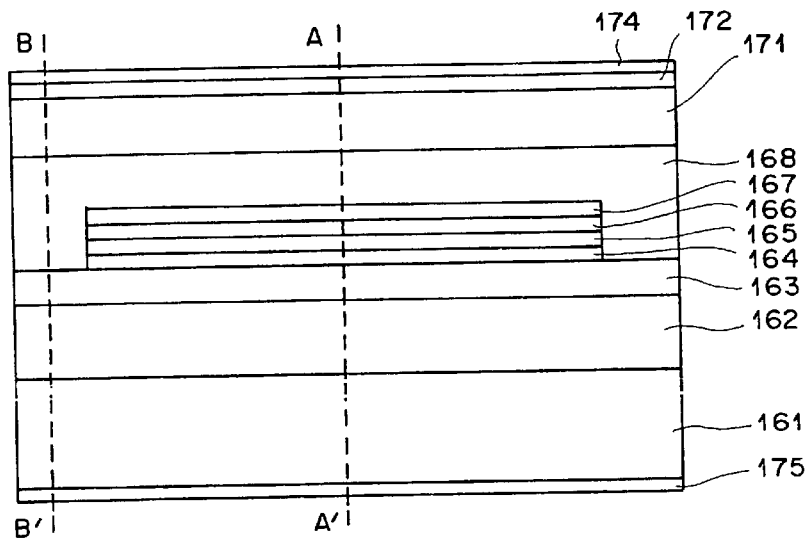
FIGS. 10A to 10C are cross-sectional views of a semiconductor laser device as the tenth embodiment of the present invention.
Figure 10B:
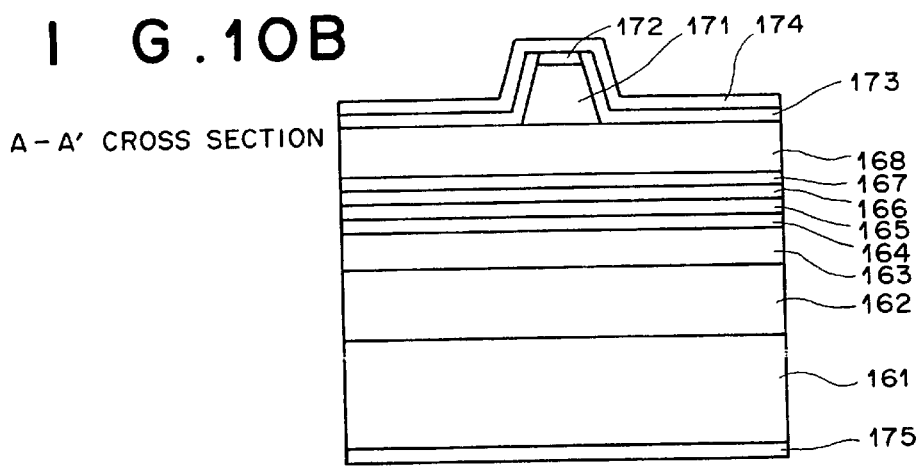
Figure 10C:
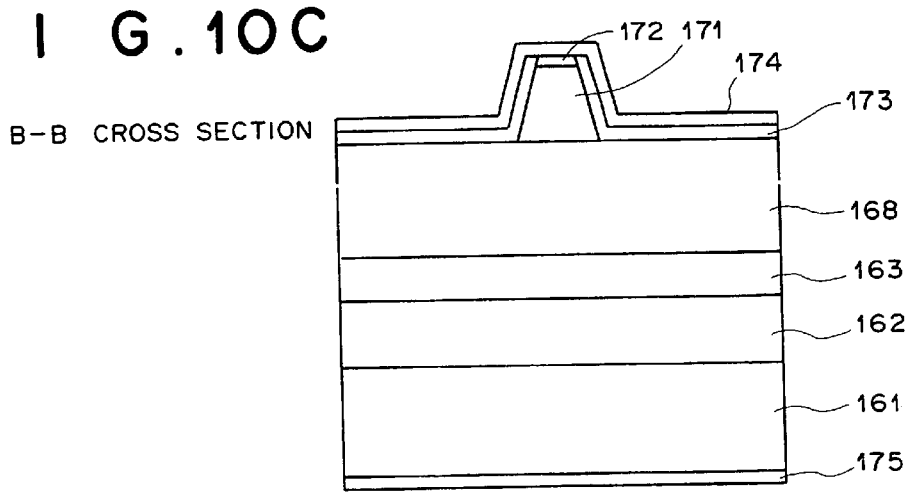

A tenth embodiment of the present invention is shown in FIGS. 10A to 10C. In the drawings, FIG. 10A is a sectional side view including an active region. FIG. 10B is a sectional view taken along the line A–A', which shows the central portion of the semiconductor laser device in the direction perpendicular to a resonance direction thereof. FIG. 10C is a sectional view taken along the line B–B', which is the sectional view in the vicinity of an end face of the semiconductor laser device in the direction perpendicular to the resonance direction thereof. Only differences of a semiconductor laser device from that of the ninth embodiment will be described. The same layer as those in the ninth embodiment are denoted by the same reference numerals, and detailed descriptions for them are omitted.

A semiconductor laser device of the tenth embodiment of the present invention does not comprise the p-type $Ga_{1-z1}Al_{z1}As$ first cladding layer 169, the p-type $In_{0.49}Ga_{0.51}P$ etching stop layer 170 formed on the upper optical waveguide layer 168 in the ninth embodiment. As described above, the p-type cladding layer part may comprise only one p-type cladding layer.

Note that the upper optical waveguide layer 168 shall have a film thickness with which the semiconductor laser device can realize a high output power in a fundamental transverse mode. Specifically, the film thickness is set so that an equivalent refractive index step difference is in a range from $1.5 \times 10^{-3}$ to $7 \times 10^{-3}$.

In the semiconductor laser devices from the fifth to tenth embodiments, the composition of the $In_{x3}Ga_{1-x3}As_{y3}P_{1-y3}$ compressive strain active layer is controlled in a range of $0.49y3 \leq x3 \leq 0.4$ and $0 \leq y3 \leq 0.1$, whereby an oscillation wavelength can be controlled in a range of $900 < \lambda 1200$ (nm).

As a growth method of each semiconductor layer, a molecular beam epitaxial growth method using a solid or a gaseous raw material may be employed.

Particularly, the suffixes x, y and z that are not particularly range-specified have values ranging from 0 to 1, and they are properly decided depending on lattice match conditions, lattice unmatched conditions, a scale of a band gap and a magnitude of a refractive index regarding an oscillation wavelength.

In the above described embodiments, though the n-type GaAs substrate was used, a p-type GaAs substrate may be also employed. In this case, layers having opposite conductivity type to those of the layers used in the semiconductor laser devices in the above described embodiments may be laminated.

A semiconductor laser element according to each of the above-described embodiments can generate a laser beam with a high level optical output while maintaining a fundamental transverse mode. The present invention is effective not only in laser elements that oscillate a fundamental transverse mode, but in semiconductor laser elements that oscillate in a multi-mode having an oscillation region width of 3 μm or wider, and thus a highly reliable semiconductor laser element of a multi-mode oscillation with low-noise and high-output oscillation can be obtained.

What is claimed is:

1. A semiconductor laser device comprising:
   a GaAs substrate of a first conductive type;
   a lower cladding layer of said first conductive type, formed on said GaAs substrate;
   a lower optical waveguide layer made of InGaP of an undoped type or said first conductive type, and formed on said lower cladding layer;
   an active layer made of InGaAsP or InGaAs, and formed on said lower optical waveguide layer except for near-edge areas of said lower optical waveguide layer which are adjacent to opposite end faces of said semiconductor laser device, where said opposite end faces are perpendicular to a direction of laser light which oscillates in said semiconductor laser device;
   a first upper optical waveguide layer made of InGaP of an undoped type or a second conductive type, and formed on said active layer;
   a second upper optical waveguide layer made of InGaP of an undoped type or said second conductive type, and formed over said first upper optical waveguide layer and said near-edge areas of said lower optical waveguide layer;
   an upper cladding layer of said second conductive type, formed on said second upper optical waveguide layer; and
   a contact layer of said second conductive type, formed on said upper cladding layer.

2. A semiconductor laser device according to claim 1, wherein a ridge structure is formed by removing more than one portion of said upper cladding layer and said contact layer, and a bottom of said ridge structure has a width of 1.5 μm or more.

3. A semiconductor laser device according to claim 1, further comprising an additional layer made of InGaAlP of said first conductive type, and formed on said second upper optical waveguide layer other than a stripe area of said second upper optical waveguide layer so as to form a stripe groove realizing a current injection window, said upper cladding layer is formed over said additional layer so as to fill said stripe groove, and a bottom of said stripe groove has a width of 1.5 μm or more.

4. A semiconductor laser device according to claim 1, wherein said active layer is made of $In_{x1}Ga_{1-x1}As_{1-y1}P_{y1}$, where $0 \leq x1 \leq 0.3$, and $0 \leq y1 \leq 0.5$, and a product of a strain and a thickness of said active layer is in a range of −0.15 to +0.15 nm.

5. A semiconductor laser device according to claim 1, wherein said active layer is a strained, single or multiple quantum well active layer, barrier layers made of InGaP are formed immediately above and under said strained quantum well active layer, said at least one barrier layer is oppositely strained to said strained quantum well active layer, and a sum of a first product and a second product is in a range of −0.15 to +0.15 nm, where said first product is a product of a strain and a thickness of said active layer, and said second product is a product of a strain and a total thickness of said at least one barrier layer.

6. A semiconductor laser device according to claim 1, wherein each of said lower cladding layer and said upper cladding layer is made of $Al_{z1}Ga_{1-z1}As$, or $In_{x3}(Al_{z3}Ga_{1-z3})_{1-x3}As_{1-y3}P_{y3}$, where $0.55 \leq z1 \leq 0.8$, $x3 = 0.49y3 \pm 0.01$, $0 < y3 \leq 1$, and $0 < z3 \leq 1$.

7. A semiconductor laser device according to claim 1, wherein each of said lower optical waveguide layer and said first upper optical waveguide layers is made of $In_{x2}Ga_{1-x2}P$, where $x2 = 0.49 \pm 0.01$.

8. A semiconductor laser device comprising:
   a GaAs substrate of a first conductivity type; and
   a semiconductor layer formed on said GaAs substrate, said semiconductor layer including:
   a cladding layer of the first conductive type, formed on said GaAs substrate;
   a lower optical waveguide layer made of InGaP of an undoped type or the first conductive type, said lower optical waveguide layer being formed on said lower cladding layer;
   a compressive strain active layer made of any one of InGaAsP and InGaAs, said compressive strain active layer being formed on said lower optical waveguide layer;
   an upper optical waveguide layer made of InGaP of an undoped type or a second conductive type, said upper optical waveguide layer being formed on said compressive strain active layer; and
   a cladding layer part of the second conductive type,
   wherein a lower barrier layer made of InGaAsP having a band gap larger than that of said compressive strain active layer is provided between said lower optical waveguide layer and said compressive strain active layer,
   an upper barrier layer made of InGaAsP having a band gap lager than that of said compressive strain active layer is provided between said compressive strain active layer and said upper waveguide layer,
   portions of said lower barrier layer, said compressive strain active layer and said upper barrier layer are removed, said portions being adjacent to two opposite end faces among end faces obtained by cleaving said semiconductor layer, said two opposite end faces constituting a resonator end face,
   said lower and upper optical waveguide layers have band gaps larger than that of said compressive strain active layer, and
   said upper optical waveguide layer is buried in the removed portions of said lower barrier layer, said compressive strain active layer and said upper barrier layer.

9. A semiconductor laser device according to claim 8, wherein said compressive strain active layer is made of $In_{x3}Ga_{1-x3}As_{1-y3}P_{y3}$, where $0.49y3 < x3 \leq 0.4$ and $0 \leq y3 \leq 0.1$.

10. A semiconductor laser device according to claim 8, wherein a contact layer of the second conductive type is formed in a region on said second conductive type cladding layer part, the region excluding a region corresponding to the portions where said lower barrier layer, said compressive strain active layer and said upper barrier layer are removed, and an insulating film is formed in a region on said second conductive type cladding layer part, the region corresponding to said portions where said lower barrier layer, said compressive strain active layer and said upper barrier layer are removed.

11. A semiconductor laser device according to claim 8, wherein a ridge portion is provided, which is formed by removing both sides of a stripe-shaped portion of said cladding layer part of the second conductive type extending from one resonator end face to the other resonator end face, from an upper surface of said cladding layer part of the second conductive type to a predetermined position.

12. A semiconductor laser device according to claim 8, wherein said cladding layer part of the second conductive type comprises:

a first cladding layer of the second conductive type, being formed on said upper optical waveguide layer;

a first etching stop layer of the second conductive type made of InGaP, being formed on said first cladding layer;

a second etching stop layer made of GaAs having a stripe-shaped current injection opening extending from one resonator end face to the other resonator end face, said second etching stop layer being formed on said first etching stop layer;

a current confinement layer of the first conductive type made of InGaAlP having a stripe-shaped current injection opening extending from one resonator end face to the other resonator end face, said current confinement layer being formed on said second etching stop layer;

a cap layer of the first conductive type made of InGaP having a stripe-shaped current injection opening extending from one resonator end face to the other resonator end face, said cap layer being formed on said current confinement layer; and a second cladding layer of the second conductive type, being formed on said cap layer.

13. A semiconductor laser device according to claim 8, wherein said cladding layer part of the second conductive type comprises:

an etching stop layer made of GaAs having a stripe-shaped current injection opening extending from one resonator end face to the other resonator end face, said etching stop layer being formed on said upper optical waveguide layer;

a current confinement layer of the first conductive type made of InGaAlP having a stripe-shaped current injection opening extending from one resonator end face to the other resonator end face, said current confinement layer being formed on said etching stop layer;

a cap layer of the first conductive type made of InGaP having a stripe-shaped current injection opening extending from one resonator end face to the other resonator end face, said cap layer being formed on said current confinement layer; and a cladding layer of the second conductive type, being formed on said cap layer.

14. A semiconductor laser device according to claim 8, wherein each of said cladding layers is made of any one of AlGaAs, InGaAlP and InGaAlAsP, which are lattice-matched with said GaAs substrate.

15. A semiconductor laser device according to claim 8, wherein said lower and upper barrier layers are respectively composed of $In_{x1}Ga_{1-x1}As_{1-y1}P_{y1}$ where $0 \leq x1 \leq 0.3$ and $0 \leq y1 \leq 0.6$ 16. A semiconductor laser device according to claim 8, wherein said lower and upper barrier layers are respectively composed of two layers including a barrier layer made of $In_{x2}Ga_{1-x2}As_{1-y2}P_{y2}$ where $0 \leq x2 \leq 0.3$ and $x2=0.49y2$ and a tensile strain barrier layer made of $In_{x4}Ga_{1-x4}As_{1-y4}P_{y4}$ where $0.49y4 > x4 \geq 0$ and $0 < y4 \leq 0.5$, wherein said stretch strain barrier layer of said two layers is disposed so as to be adjacent to said compressive strain active layer.

17. A method of manufacturing a semiconductor laser device in which a plurality of semiconductor layers including a compressive strain active layer are laminated on a substrate and a resonator end face is constituted by two opposite end faces, comprising the steps of:

laminating a cladding layer of a first conductive type on a GaAs substrate of a first conductive type;

forming an InGaP lower optical waveguide layer of the first conductive type or an undoped type on said cladding layer of the first conductive type, said lower optical waveguide layer having a band gap larger than that of said compressive strain active layer;

laminating an InGaAsP lower barrier layer on said lower optical waveguide layer, said lower baffler layer having a band gap larger than that of said compressive strain active layer;

laminating said compressive strain active layer made of any one of InGaAsP and InGaAs on said lower baffler layer;

laminating an InGaAsP upper barrier layer on said compressive strain active layer, said upper baffler layer having a band gap larger than that of said compressive strain active layer;

laminating an InGaP cap layer on said upper barrier layer; laminating a GaAs cap layer on said cap layer;

removing a portion of said GaAs cap layer in the vicinity of an end face adjacent to said resonator end face;

removing a portion of said InGaP cap layer in the vicinity of said end face using said GaAs cap layer as a mask;

removing said GaAs cap layer used as the mask and simultaneously removing portions of said upper barrier layer, said compressive strain active layer and said lower barrier layer in the vicinity of said end face, using said InGaP cap layer as a mask;

forming an InGaP upper optical waveguide layer of a second conductive type or an undoped type having a band gap larger than that of said compressive strain active layer on said removed portions in the vicinity of said end face and said InGaP cap layer; and forming a cladding layer part of the second conductive type on said upper optical waveguide layer.

18. A method of manufacturing a semiconductor laser device according to claim 17, wherein said cladding layer part of the second conductive type is formed by the steps of:

laminating a first cladding layer of the second conductive type on said upper optical waveguide layer;

laminating an InGaP first etching stop layer of the second conductive type on said first cladding layer;

laminating a GaAs second etching stop layer on said first etching stop layer;

laminating an InGaAlP current confinement layer of the first conductive type on said second etching stop layer;

laminating an InGaP cap layer of the first conductive type on said current confinement layer;

laminating a second GaAs cap layer on said InGaP cap layer;

removing a portion of said second GaAs cap layer corresponding to a stripe-shaped current injection opening;

removing portions of said InGaP cap layer of the first conductive type and said current confinement layer, which are to be used as said current injection opening, using the second GaAs cap layer as a mask;

removing said second GaAs cap layer used as the mask and simultaneously removing a portion of said second etching stop layer, which is to be used as said current injection opening, using said InGaP cap layer of the first conductive type as a mask; and forming a second cladding layer of the second conductive type so as to cover said current injection opening.

19. A method of manufacturing a semiconductor laser device according to claim 17, wherein said cladding layer part of the second conductive type is formed by the steps of:

laminating a GaAs etching stop layer on said upper optical waveguide layer;

laminating an InGaAlP current confinement layer of the first conductive type on said second etching stop layer;

laminating an InGaP cap layer of the first conductive type on said current confinement layer;

laminating a second GaAs cap layer on said InGaP cap layer;

removing a portion of said second GaAs cap layer corresponding to a stripe-shaped current injection opening;

removing portions of said InGaP cap layer of the first conductive type and said current confinement layer, which are to be used as said current injection opening, using said second GaAs cap layer as a mask;

removing said second GaAs cap layer used as the mask and simultaneously removing a portion of said GaAs etching stop layer, which is to be used as said current injection opening, using said InGaP cap layer of the first conductive type as a mask; and forming a cladding layer of the second conductive type so as to cover said current injection opening.

* * * * *